(12) United States Patent
Kang et al.

(10) Patent No.: US 11,121,151 B2
(45) Date of Patent: Sep. 14, 2021

(54) VERTICAL SEMICONDUCTOR DEVICES

(71) Applicant: Samsung Electronics Co., Ltd., Suwon-si (KR)

(72) Inventors: Shinhwan Kang, Suwon-si (KR); Younghwan Son, Suwon-si (KR); Haemin Lee, Suwon-si (KR); Kohji Kanamori, Suwon-si (KR); Jeehoon Han, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 19 days.

(21) Appl. No.: 16/562,919

(22) Filed: Sep. 6, 2019

(65) Prior Publication Data
US 2020/0343259 A1    Oct. 29, 2020

(30) Foreign Application Priority Data

Apr. 25, 2019    (KR) .................. 10-2019-0048138

(51) Int. Cl.
| | |
|---|---|
| H01L 27/00 | (2006.01) |
| H01L 27/11582 | (2017.01) |
| H01L 27/11565 | (2017.01) |
| H01L 27/11519 | (2017.01) |
| H01L 27/11556 | (2017.01) |
| H01L 27/1157 | (2017.01) |

(52) U.S. Cl.
CPC .. *H01L 27/11582* (2013.01); *H01L 27/11519* (2013.01); *H01L 27/11556* (2013.01); *H01L 27/11565* (2013.01); *H01L 27/1157* (2013.01)

(58) Field of Classification Search
None
See application file for complete search history.

(56) References Cited

U.S. PATENT DOCUMENTS

| | | | |
|---|---|---|---|
| 8,729,622 B2 | 5/2014 | Moon et al. | |
| 9,331,095 B2 | 5/2016 | Shim et al. | |
| 9,391,090 B2 | 7/2016 | Manorotkul et al. | |
| 9,576,973 B2 | 2/2017 | Lee et al. | |
| 9,691,782 B1 | 6/2017 | Hwanq et al. | |
| 2017/0040337 A1* | 2/2017 | Kim | H01L 27/11582 |
| 2018/0358375 A1 | 12/2018 | Ku et al. | |

FOREIGN PATENT DOCUMENTS

| | | |
|---|---|---|
| KR | 2015-0116995 A | 10/2015 |
| KR | 2018-0135643 A | 12/2018 |

* cited by examiner

*Primary Examiner* — Reema Patel
(74) *Attorney, Agent, or Firm* — Harness, Dickey & Pierce, P.L.C.

(57) ABSTRACT

A vertical semiconductor device may include a stacked structure and a plurality of channel structures. The stacked structure may include insulation layers and gate patterns alternately and repeatedly stacked on a substrate. The stacked structure may extend in a first direction parallel to an upper surface of the substrate. The gate patterns may include at least ones of first gate patterns. The stacked structure may include a sacrificial pattern between the first gate patterns. The channel structures may pass through the stacked structure. Each of the channel structures may extend to the upper surface of the substrate, and each of the channel structures may include a charge storage structure and a channel. Ones of the channel structures may pass through the sacrificial pattern in the stacked structure to the upper surface of the substrate, and may extend to the upper surface of the substrate.

20 Claims, 31 Drawing Sheets

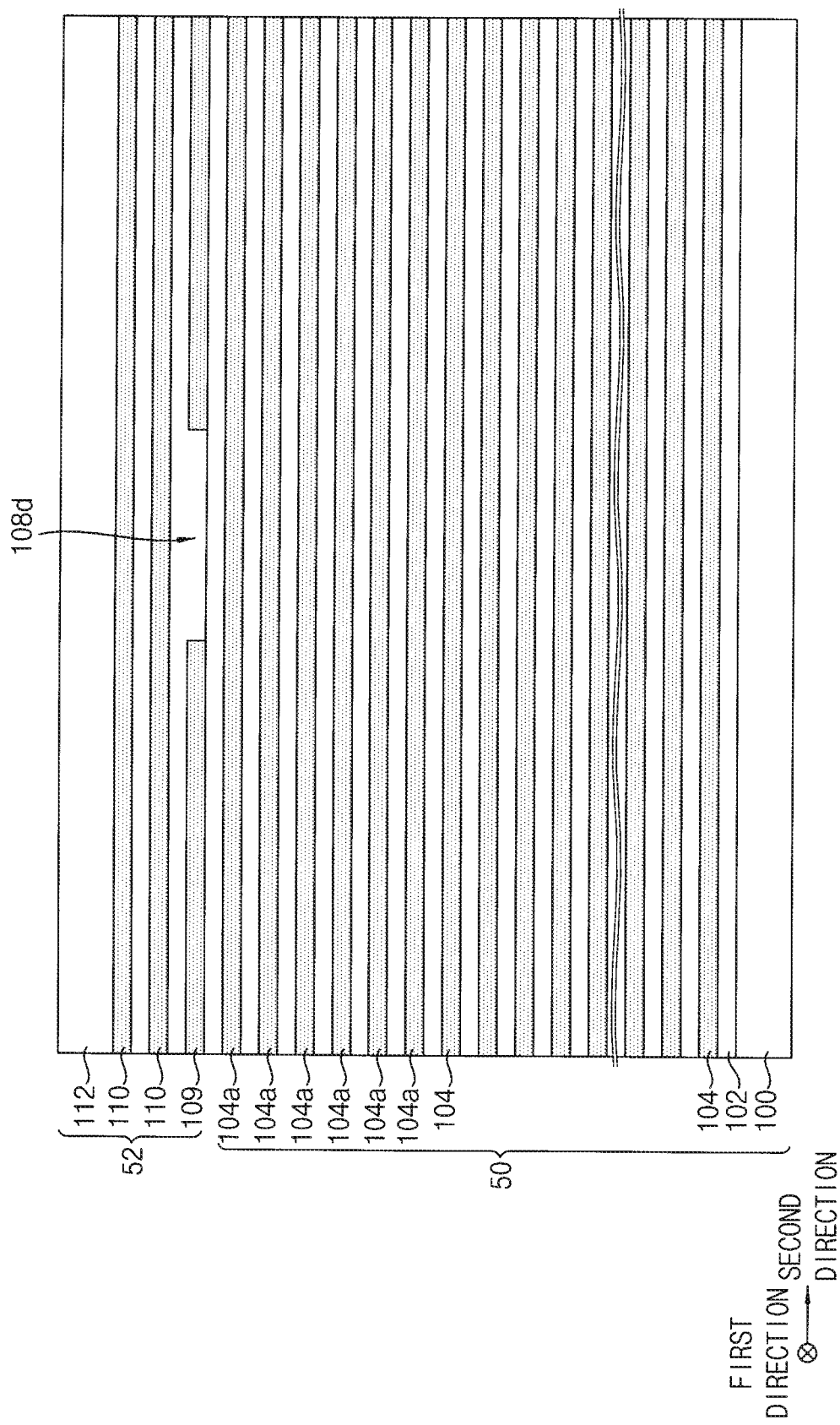

VERTICAL SEMICONDUCTOR DEVICES

CROSS-REFERENCE TO RELATED APPLICATION

This application claims priority under 35 USC § 119 to Korean Patent Application No. 10-2019-0048138, filed on Apr. 25, 2019, in the Korean Intellectual Property Office (KIPO), the contents of which are incorporated by reference herein in their entirety.

BACKGROUND

Example embodiments relate to vertical semiconductor devices and/or method for manufacturing the same.

A vertical semiconductor device may include memory cells stacked in a direction perpendicular to a surface of a substrate. The vertical semiconductor device may include a stacked structure including gate patterns and insulation patterns alternately and repeatedly stacked. As the number of stacked memory cells increases, thus increasing a height of the stack, an aspect ratio of the stacked structure may increase. Thus, forming the stacked structure having a stable structure may be difficult.

SUMMARY

Some example embodiments provide a vertical semiconductor device having a stable structure and/or excellent or improved electrical characteristics.

Some example embodiments provide method of manufacturing a vertical semiconductor device having a stable structure and/or excellent or improved electrical characteristics.

According to some example embodiments, there is provided a vertical semiconductor device including a substrate including an upper surface, a stacked structure including insulation layers and gate patterns, the insulation layers alternately and repeatedly stacked with the gate patterns on the substrate, the stacked structure extending in a first direction parallel to the upper surface of the substrate, the gate patterns including at least ones of first gate patterns, and the stacked structure including a sacrificial pattern between the first gate patterns, and a plurality of channel structures passing through the stacked structure, each of the channel structures extending to the upper surface of the substrate, and each of the channel structures including a charge storage structure and a channel. In the stacked structure, at least one of the channel structures passes through the sacrificial pattern to the upper surface of the substrate and extends to the upper surface of the substrate.

According to some example embodiments, there is provided a vertical semiconductor device including a substrate including an upper surface, a stacked structure including insulation layers and gate patterns on the substrate, the insulation layers alternately and repeatedly stacked with the gate patterns, the stacked structure extending in a first direction, the first direction parallel to the upper surface of the substrate, the gate patterns including at least ones of first gate patterns, and the first gate patterns are spaced apart from each other at the same level in a second direction, the second direction parallel to the upper surface of the substrate and perpendicular to the first direction, and first channel structures and second channel structures, the first channel structures and the second channel structures passing through the stacked structure, each of the first channel structures and second channel structures extending to the upper surface of the substrate, and each of the first and second channel structures including a charge storage structure and a channel. Each of the first channel structures passes through the first gate patterns, and each of the second channel structures passes through a portion between the first gate patterns.

According to some example embodiments, there is provided a vertical semiconductor device including a substrate having an upper surface, a stacked structure including insulation layers and gate patterns on the substrate, the insulation layers alternately and repeatedly stacked with the gate patterns, the stacked structure extending in a first direction parallel to the upper surface of the substrate, the gate patterns including at least one of first gate patterns, the stacked structure including a sacrificial pattern between the first gate patterns, and first channel structures and second channel structures, the first channel structures and the second channel structures passing through the stacked structure, each of the first channel structures and second channel structures extending to the upper surface of the substrate, and each of the first and second channel structures including a charge storage structure and a channel. A plurality of first channel structures and second channel structures are arranged in a second direction, the second direction parallel to the upper surface of the substrate and perpendicular to the first direction in the stacked structure. Each of the first channel structures passes through the first gate patterns. Each of the second channel structures passes through the sacrificial pattern.

In some example embodiments, in the vertical semiconductor device, the stacked structure may include the sacrificial pattern between ones of gate patterns in the second direction. Further, some of the channel structures may pass through the sacrificial pattern.

As ones of the gate patterns may be spaced apart from each other by the sacrificial layer patterns, the string selection transistors may be selectively programmed. Therefore, the number of channel structures arranged in the second direction in the stacked structure may be increased, so that an aspect ratio of the stacked structure may be reduced. Thus, the vertical semiconductor device may have a stable structure and/or improved fabrication capabilities.

BRIEF DESCRIPTION OF THE DRAWINGS

Example embodiments will be more clearly understood from the following detailed description taken in conjunction with the accompanying drawings. FIGS. 1 to 31 represent non-limiting, example embodiments as described herein.

FIGS. 1 and 2 are a cross-sectional view and a plan view illustrating a vertical semiconductor device in accordance with some example embodiments, respectively;

FIG. 3 is a plan view a vertical semiconductor device in accordance with some example embodiments;

FIG. 4 is a circuit diagram of a vertical semiconductor device in accordance with some example embodiments;

FIGS. 5 to 7 are cross-sectional views illustrating steps of programming the upper selection transistor and the string selection transistor;

FIGS. 8 to 18 are cross-sectional views and plan views illustrating stages of a method of manufacturing a vertical semiconductor device in accordance with some example embodiments;

FIGS. 19 and 20 are a cross-sectional view and a circuit diagram illustrating a vertical semiconductor device in accordance with some example embodiments, respectively;

FIGS. 21 to 24 are cross-sectional views illustrating stages of a method of manufacturing a vertical semiconductor device in accordance with some example embodiments;

FIGS. 25 and 26 are a cross-sectional view and a circuit diagram illustrating a vertical semiconductor device in accordance with some example embodiments, respectively;

FIGS. 27 and 28 are cross-sectional views illustrating stages of a method of manufacturing a vertical semiconductor device in accordance with some example embodiments;

FIG. 29 is a cross-sectional view illustrating a vertical semiconductor device according to example embodiments;

FIG. 30 is a cross-sectional view illustrating a vertical semiconductor device in accordance with some example embodiments; and FIG. 31 is a cross-sectional view illustrating a method of manufacturing a vertical semiconductor device in accordance with some example embodiments.

DESCRIPTION OF EXAMPLE EMBODIMENTS

Some example embodiments will be more clearly understood from the following detailed description taken in conjunction with the accompanying drawings.

Hereinafter, directions substantially parallel to an upper surface of the substrate is defined as horizontal directions, and a direction substantially perpendicular to the upper surface of the substrate are defined as a vertical direction. The horizontal directions may include a first direction and a second direction perpendicular to the first direction.

Figure 1:
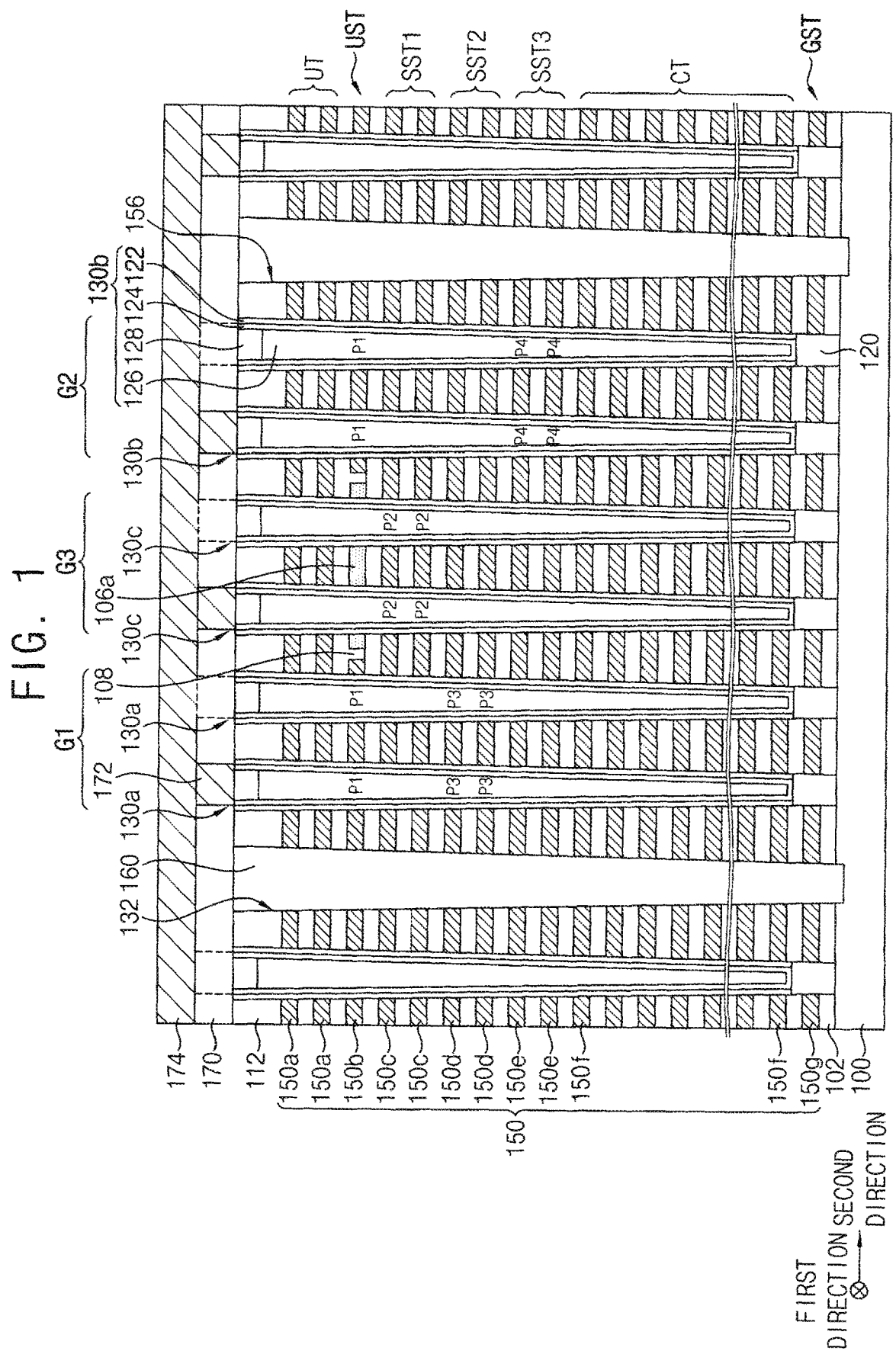
Figure 2:
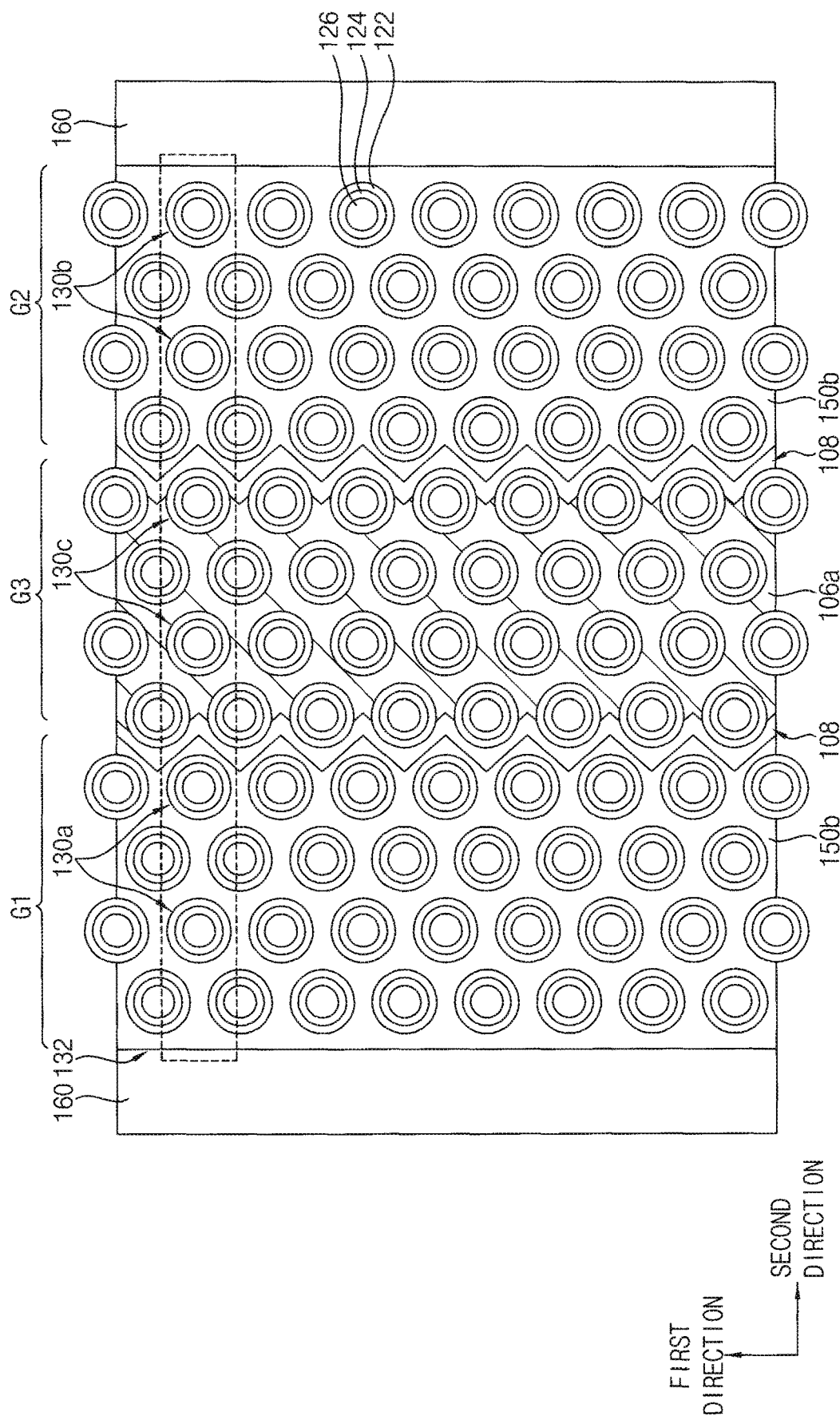
Figure 3:
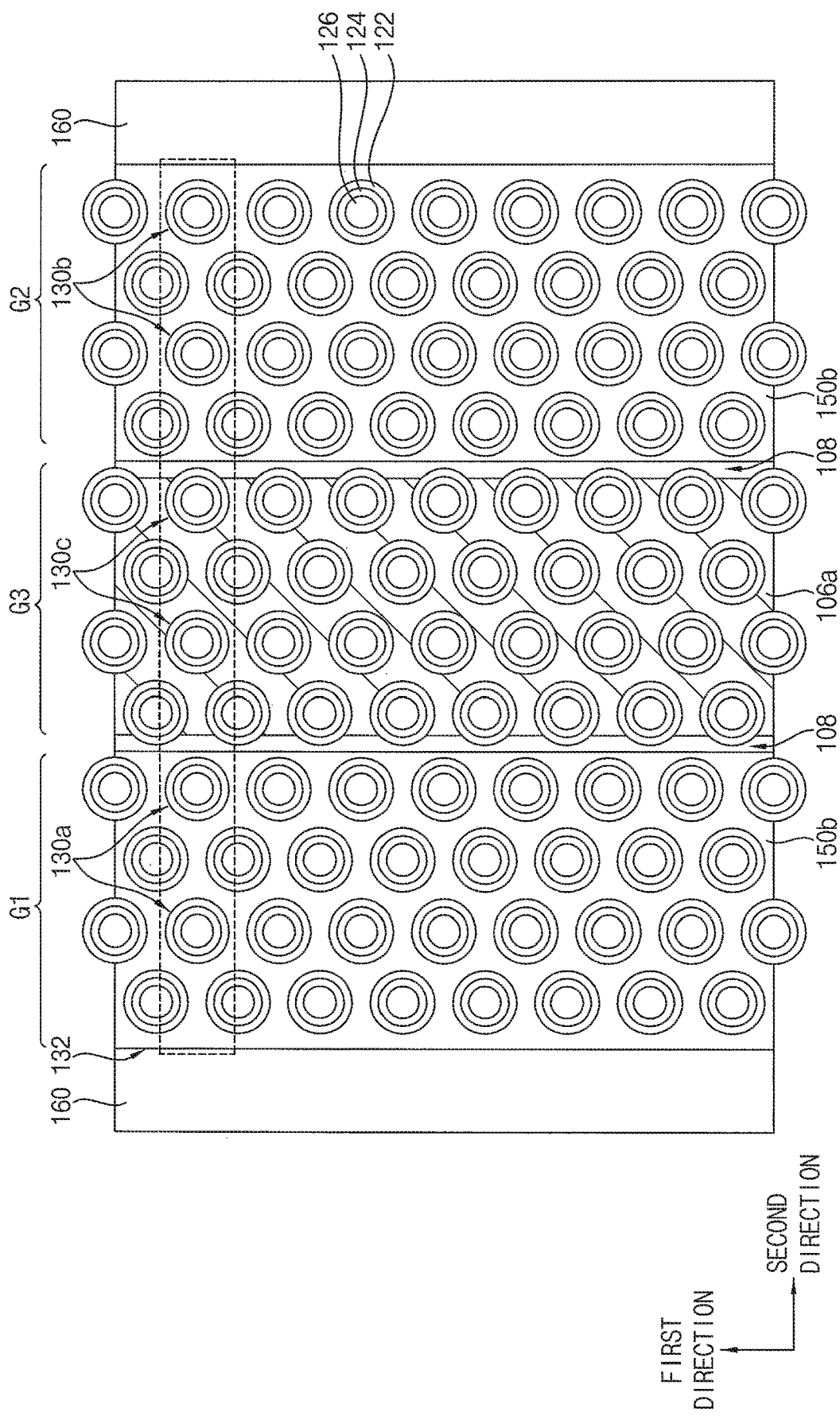
Figure 4:
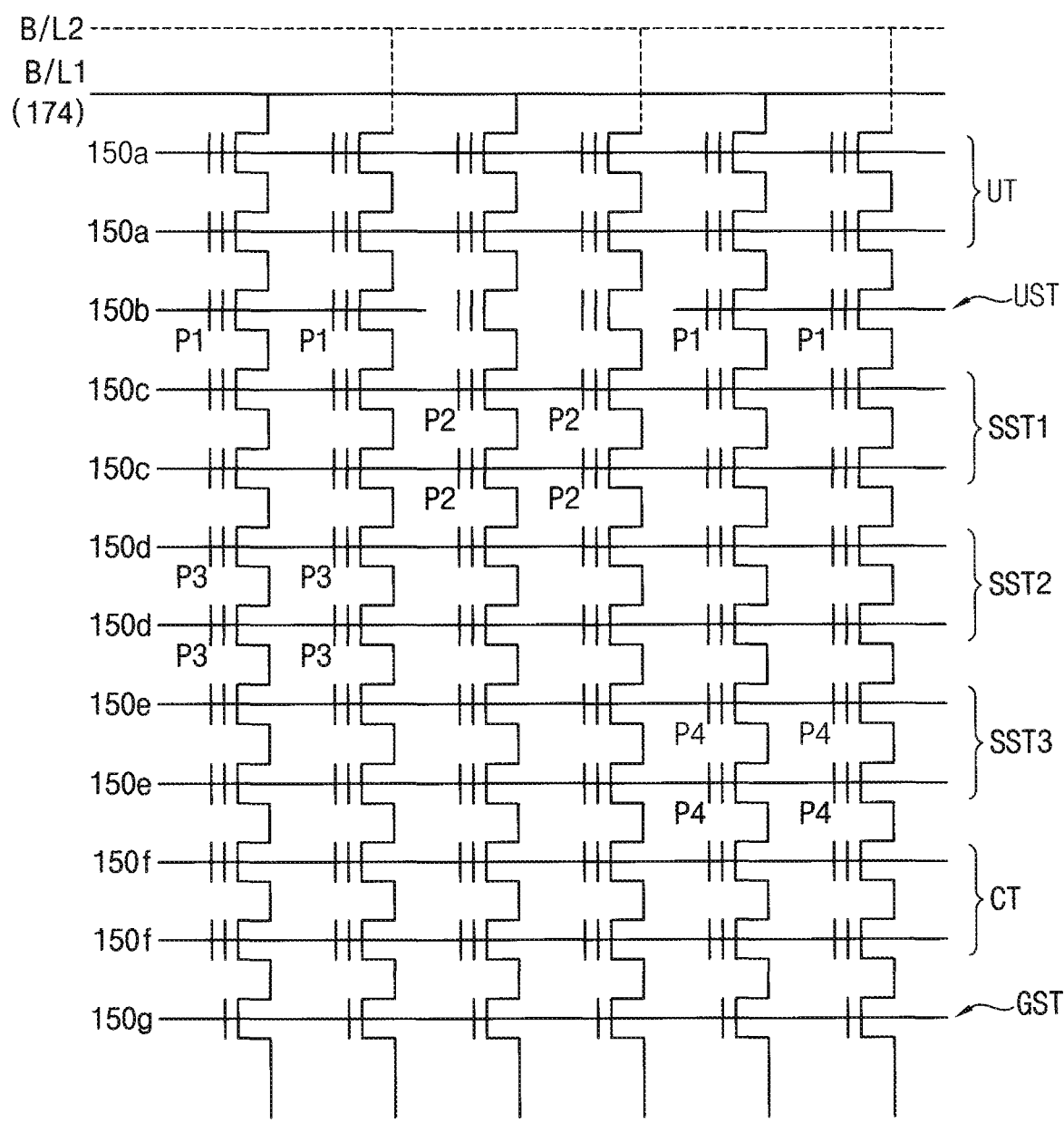

FIGS. 1 and 2 are a cross-sectional view and a plan view illustrating a vertical semiconductor device in accordance with some example embodiments, respectively. FIG. 3 is a plan view a vertical semiconductor device in accordance with some example embodiments. FIG. 4 is a circuit diagram of a vertical semiconductor device in accordance with some example embodiments.

FIGS. 2 and 3 are plan views along the horizontal direction of an upper selection transistor UST.

Referring to FIGS. 1, 2 and 4, the vertical semiconductor device includes a stacked structure 156 formed on a substrate 100, and channel structures 130a, 130b, and 130c passing through the stacked structure 156. In addition, bit line structures 172 and 174 may be provided on the stacked structure 156 to be electrically connected to the channel structures 130a, 130b, and 130c. The stacked structure 156 may include an intermediate sacrificial pattern 106a. Further, some channel structures 130c among the channel structures 130a, 130b and 130c may pass through the intermediate sacrificial pattern 106a.

The substrate 100 may include a heterogeneous or homogenous group IV semiconductor material, e.g., silicon, germanium, silicon-germanium, or a heterogeneous group III-V semiconductor compounds, e.g., GaP, GaAs, GaSb, etc. In some example embodiments, the substrate 100 may be or include a silicon-on-insulator (SOI) substrate or a germanium-on-insulator (GOI) substrate.

The stacked structure 156 may include insulation layers 102 and gate patterns 150 alternately and repeatedly stacked. An upper insulation layer 112 may be disposed on an uppermost portion of the stacked structure 156. The stacked structure 156 may extend in the first direction. The plurality of stacked structures 156 may be arranged in the second direction, and second trenches 132 may extend in the first direction between the stacked structures 156. An insulation pattern 160 may be formed in each of the second trenches 132.

The stacked structure 156 may include a first portion positioned and a second portion above the first portion. The gate patterns included in a ground selection transistor GST, cell transistors CT, and string selection transistors SST1, SST2, and SST3 may be formed in the first portion of the stacked structure 156. The gate patterns included in the upper selection transistor UST and the upper transistor UT may be formed in the second portion of the stacked structure 156.

In some example embodiments, the upper selection transistors UST may be disposed at a lowermost portion of the second portion of the stack structure 156. The upper selection transistors UST may include gate patterns 150b separated from each other in the second direction. Further, the intermediate sacrificial pattern 106a may be formed between separated gate patterns 150b. A first trench 108 may be formed between the gate pattern 150b of the upper selection transistor UST and the intermediate sacrificial pattern 106a.

The first trench 108 may extend in a first direction.

In some example embodiments, as shown in FIG. 2, the first trench 108 may extend, e.g. extend in the first direction, in a zig-zag fashion. As the first trench 108 extends in the zig-zag fashion, a process margin for forming the gate pattern 150 surrounding the channel structures 130a, 130b, and 130c may be increased.

In some example embodiments, as shown in FIG. 3, the first trench 108 may extend, e.g. extend in the first direction, in a straight line.

In some example embodiments, the gate pattern 150 may include a barrier layer (not shown) and a gate conductive layer. The gate conductive layer may include a metal having a high gap-filling property and/or a low resistance. The gate conductive layer may include, for example, at least one of tungsten, titanium, tantalum, platinum, or the like, and the barrier layer may include a metal nitride such as at least one of tungsten nitride, titanium nitride, tantalum nitride, or the like. The gate conductive layer may be formed with a chemical vapor deposition (CVD) process and/or a physical vapor deposition (PVD) process.

The insulation layers 102 may include, e.g., an oxide such as silicon oxide. In some example embodiments, the intermediate sacrificial pattern 106a may include an insulation material having a high etch selectivity with respect to the insulation layers. The intermediate sacrificial pattern 106a may include a nitride, such as silicon nitride. The intermediate sacrificial pattern 106a may not include an oxide, and similarly the insulation layer 102 may not include a nitride. The insulation layer 102 and/or the intermediate sacrificial pattern 106a may be formed with a chemical vapor deposition (CVD) process In some example embodiments, the upper transistor UT may correspond to, e.g. serve as, an assist transistor for an inversion in programming of transistors thereunder. Additionally or alternatively, in some example embodiments, the upper transistor UT may correspond to, e.g. serve as, a gate induced drain leakage (GIDL) transistor for erasing of data stored in the vertical memory device.

In some example embodiments, a plurality of the upper transistors UT may be provided. In this case, a plurality of stacked gate patterns may be formed on the intermediate sacrificial pattern 106a. In some example embodiments, one upper transistor UT may be provided. In some example embodiments, the upper transistors UT may not be provided. In this case, the gate pattern 150a may not be formed on the intermediate sacrificial pattern 106a.

The channel structures 130a, 130b, and 130c may pass through the stacked structure 156, and each of the channel structures 130a, 130b, and 130c may have a pillar shape. The channel structures 130a, 130b and 130c may be formed in channel holes 118 (see FIG. 12) extending to an upper surface of the substrate 100 through the stacked structure 156.

Each of the channel structures 130a, 130b and 130c may include a charge storage structure 122, a channel 124, a filling insulation pattern 126, and an upper conductive pattern 128.

The charge storage structure 122 may include a tunnel insulation pattern, a charge storage pattern, and a blocking pattern sequentially stacked on and/or conformal to an outer wall of the channel 124. The tunnel insulation pattern and the blocking pattern may include silicon oxide, and the charge storage pattern may include silicon nitride.

The channel 124 may be electrically connected to the substrate 100. In the channel hole 118, the channel 124 may have a cylindrical shape.

The filling insulation pattern 126 may be formed on the channel 124 to fill most of remaining portion of the channel hole 118. The filling insulation pattern 126 may include, e.g., silicon oxide.

The upper conductive pattern 128 may be formed on the filling insulation pattern 126 and may contact an upper sidewall of the channel 124. The upper conductive pattern 128 may include polysilicon, e.g. doped polysilicon. The upper conductive pattern 128 may correspond to, e.g. serve as, a pad to be electrically connected to the bit line contact 172.

The channel structures 130a, 130b, and 130c may be regularly arranged in each of the first and second directions. Each of the channel structures 130a, 130b, and 130c may correspond to, e.g. serve as, one cell string in the vertical semiconductor device.

In a cross-sectional view cut along in the horizontal direction of the stacked structure, the stacked structure 156 may include at least six channel structures 130a, 130b, and 130c.

In some example embodiments, in a cross-sectional view cut along in the horizontal direction of the stacked structure, six stacked channel structures may be formed in the stacked structure 156. For example, the stack structure 156 may include six cell strings in the second direction. The stacked structure 156 may include a first end and a second end facing the first end in the second direction.

The channel structures may be divided into a first channel structure 130a, a second channel structure 130b, and a third channel structure 130c according to positions of the channel structures in the stacked structure 156. The first channel structure 130a may be adjacent to the first end, and the second channel structure 130b may be adjacent to the second end. Further, the third channel structure 130c may be disposed between the first and second channel structures 130a and 130b.

Further, the cell strings may include a first group G1 including two first channel structures 130a, a second group G2 including two second channel structures 130b, and a third group G3 including two third channel structures 130c.

The first channel structures 130a may pass through the gate pattern 150b of the upper selection transistor UST adjacent to the first end. The second channel structures 130b may pass through the gate pattern 150b of the upper selection transistor UST adjacent to the second end. Further, the third channel structures 130c may pass through the intermediate sacrificial pattern 106a.

The cell strings of the first and second groups may pass through the separated gate patterns 150b, so that the cell structure of the first and second groups may include the upper selection transistor UST. Further, the cell strings of the third group may pass through the intermediate sacrificial pattern 106a between the separated gate patterns 150b, so that the cell string of the third group may not include the upper selection transistor UST.

A first insulating interlayer 170 may be formed on the stacked structure 156, the channel structures 130a, 130b, and 130c, and the upper insulation layer 112. A bit line contact 172 may through the first insulating interlayer 170 to be electrically connected to the upper conductive pattern 128. A bit line 174 may be formed on the first insulating interlayer 170 and the bit line contact 172, and the bit line 174 may extend in the second direction. The bit line contact 172 and the bit line 174 may correspond to, e.g. serve as, the bit line structure.

In some example embodiments, a plurality of bit lines 174 may be formed on the six channel structures arranged in the second direction. For example, two bit lines, i.e., first and second bit lines (B/L1, B/L2), may be formed on the six channel structures arranged in the second direction. For example, the first bit line B/L1 extending in the second direction may contact upper surfaces of odd-numbered channel structures. Further, the second bit line B/L2 extending in the second direction may contact upper surfaces of the even-numbered channel structures.

As described above, each of the stacked structures 156 may include six or more channel structures 130a, 130b, and 130c arranged in a second direction, and the each of channel structures may correspond to, e.g. serve as, a cell string that electrically operates. As the number of the channel structures 130a, 130b and 130c arranged in the second direction in the stacked structure 156 is increased to 6 or more, a width of the stacked structure 156 may be increased. Therefore, an aspect ratio of the stacked structure 156 may be reduced, and a leaning and tilting of the stacked structure 156 may be reduced. Thus, the stacked structure 156 may have an improved structure, e.g. a stable structure.

As the number of the channel structures 130a, 130b and 130c arranged in the second direction in the stacked structure 156 increases, the number of the string selection transistors SST1, SST2, and SST3 string for selecting one of the channel structures 130a, 130b and 130c may be increased. For example, if six channel structures 130a, 130b and 130c are arranged in the second direction and two bit lines 174 connecting to the six channel structures are included in the stacked structure 156, the stacked structure 156 may include at least three string selection transistors SST1 and SST2, SST3.

Meanwhile, a channel length of each string selection transistor stacked in the vertical direction may be short, so that a short channel effect may be generated. In order to prevent or reduce the influence of the short channel effect, a plurality of transistors may be connected in series so that the transistors may be function as a single string selection transistor. As shown, one string selection transistor may include two series connected transistors. In this case, each cell string may include a total of six string selection transistors (SST1, SST2, SST3).

In some example embodiments, each string selection transistor may include only one transistor. In this case, each cell string may include a total of three string selection transistors.

In some example embodiments, some of the upper selection transistors UST and string selection transistors SST1, SST2, SST3 may be programmed to select one of the cell strings.

The upper selection transistor UST adjacent to both sides of the intermediate sacrificial pattern 106a may be programmed, so that the upper select transistor UST may have a positive threshold voltage. Further, some of the plurality of string selection transistors SST1, SST2, SST3 formed under the intermediate sacrificial pattern 106a may be programmed.

Hereinafter, programmed states and programming methods of the upper selection transistor UST and the string selection transistors SST1, SST2 and SST3 may be described.

Figure 5:
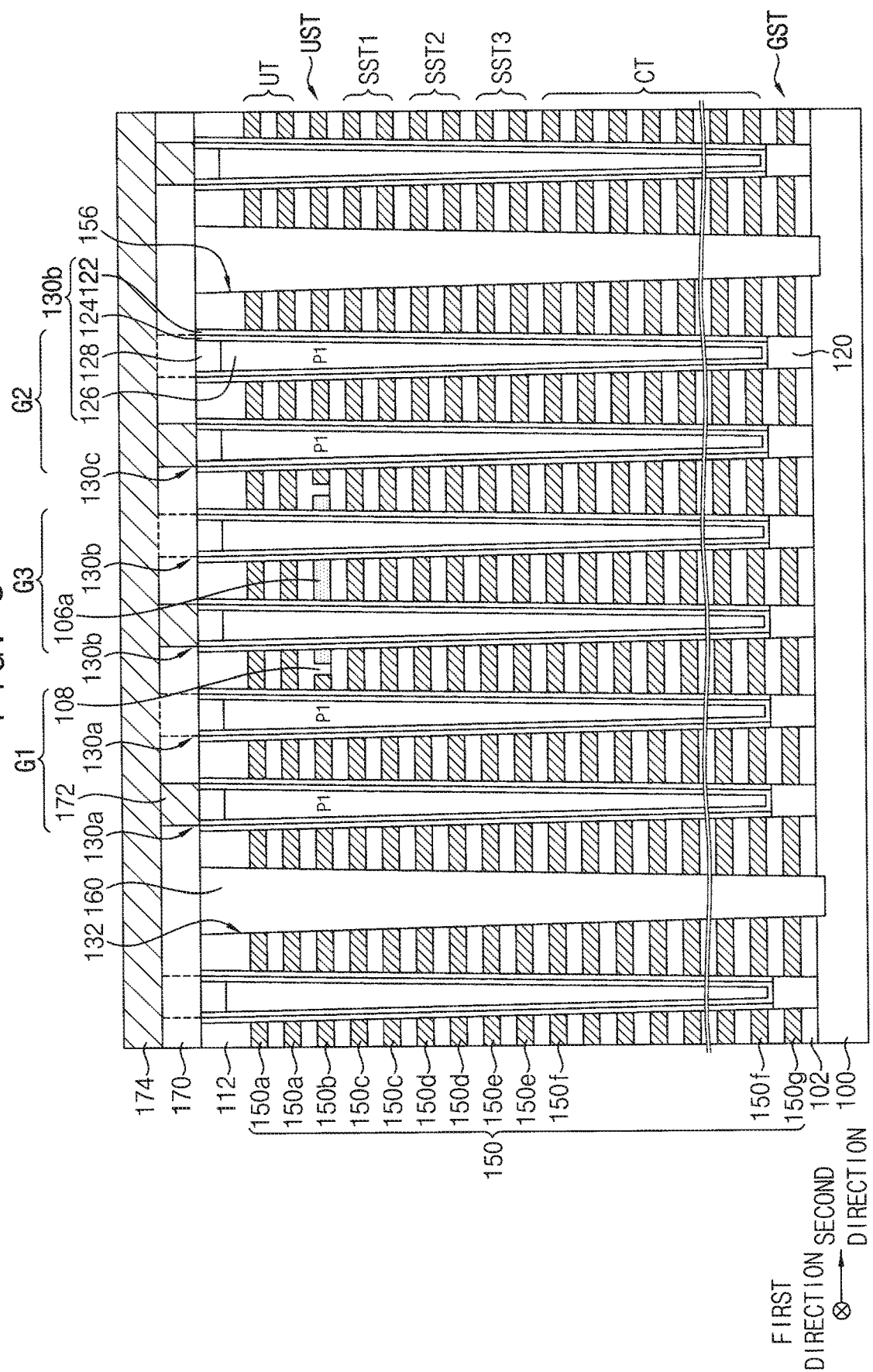
Figure 6:
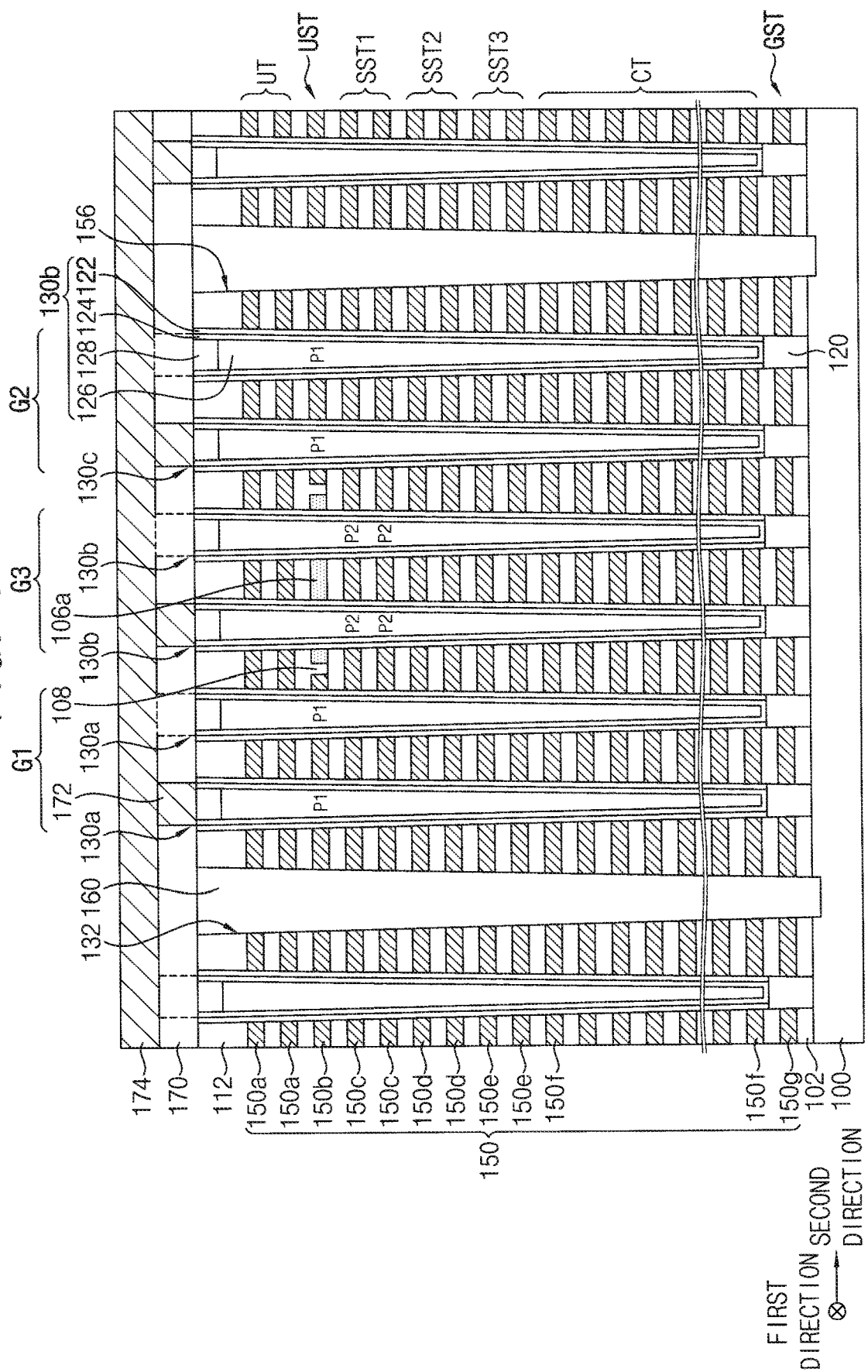
Figure 7:
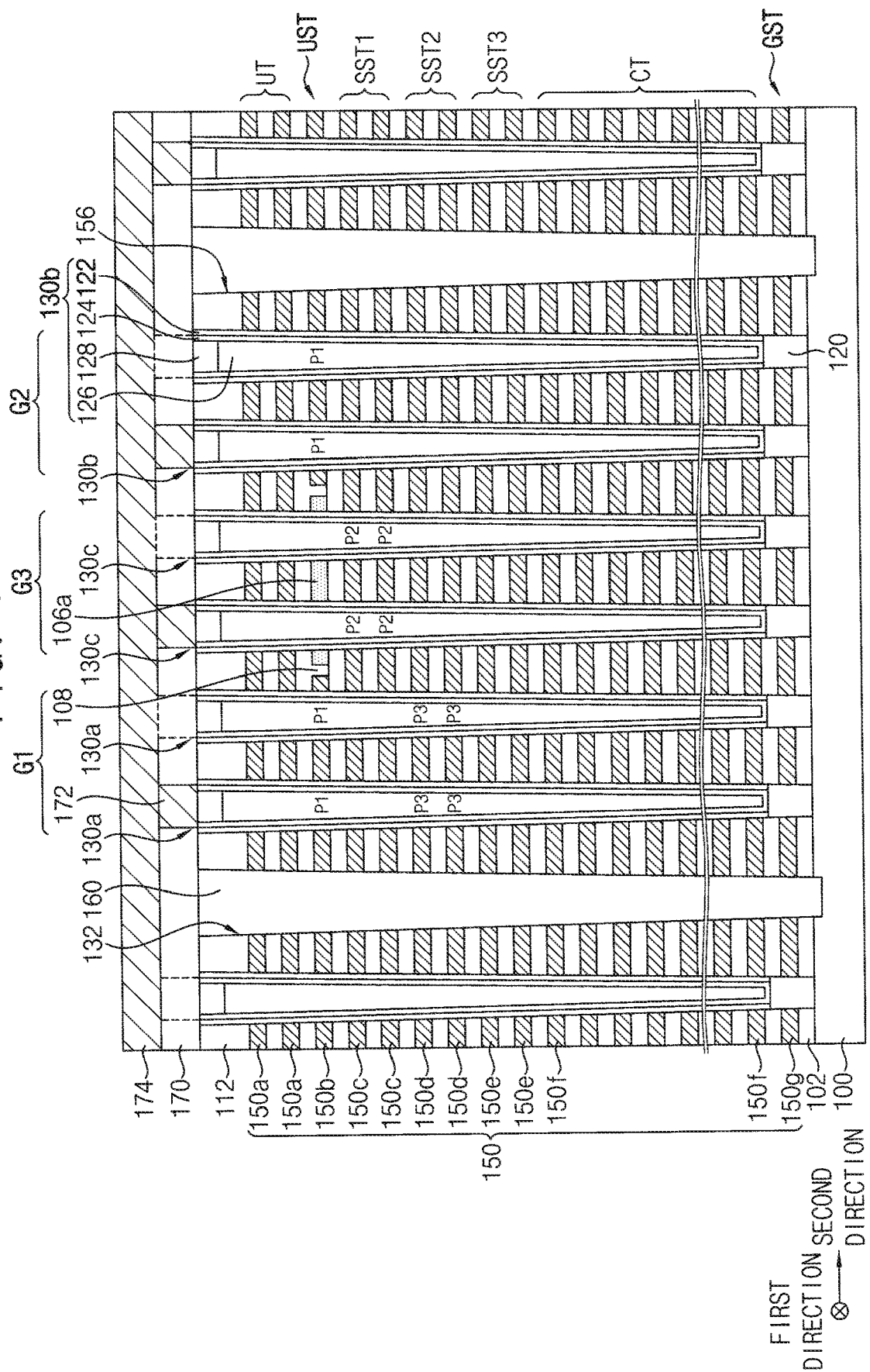

FIGS. 5 to 7 are cross-sectional views illustrating steps of programming the upper selection transistor and the string selection transistor.

As shown in FIGS. 4 to 7, one stacked structure 156 may include the six cell strings in a second direction and two bit lines formed on the six cell strings. Thus, for selecting one of the six cell strings the stacked structure 156 may include two first string selection transistors SST1, two second string selection transistors SST2, and two third string selection transistors SST3.

Referring to 4 and 5, first, the upper selection transistors UST adjacent to the both sides of the intermediate sacrificial pattern 106a may be programmed (see P1). Thus, threshold voltages of the upper selection transistors UST may increase, and the upper selection transistors UST may have positive threshold voltages. The upper selection transistors UST may correspond to, e.g. serve as, switching devices.

Referring to FIGS. 4 and 6, first string selection transistors SST1 disposed under the intermediate sacrificial pattern 106a and being opposite a lower surface of the intermediate sacrificial pattern 106a may be programmed (see P2). For example, the first string selection transistors SST1 of the third group G3 may be programmed, and the first string selection transistors SST1 of the first and second groups G1 and G2 may not be programmed.

At this time, the upper selection transistors UST may be turned off, so that the first string selection transistors SST1 of the third group G3 may be selectively programmed.

Thus, threshold voltages of the programmed first string selection transistors SST1 may increase, and the programmed first string selection transistors SST1 may have positive threshold voltages. The programmed first string selection transistors SST1 may correspond to, e.g. serve as, switching devices. Non-programmed first string selection transistors SST1 may be in a turn-on state because the non-programmed first string selection transistors SST1 may have negative threshold voltages.

Referring to FIGS. 4 and 7, the second string selection transistors SST2 disposed under the first string selection transistors SST1 of the first group G1 may be selectively programmed (see P3). In this case, the upper selection transistor UST of the first group G1 may be turned on, and the upper selection transistors UST of the second group G2 may be turned off. Further, the first string selection transistor SST1 of the third group G3 may be turned off.

Thus, threshold voltages of the programmed second string selection transistors SST2 may increase, and the programmed second string selection transistors SST2 may have positive threshold voltages. Non-programmed second string selection transistors SST2 may be in a turn-on state because the non-programmed second string selection transistors SST2 may have negative threshold voltages.

Referring to FIG. 4 and FIG. 1, the third string selection transistors SST3 disposed under the second string selection transistors SST2 of the second group G2 may be programmed (see P4).

In this case, the upper selection transistor UST of the second group G2 may be turned on and the upper selection transistor UST and the second string selection transistor SST2 of the first group G1 may be turned off. Further, the first string selection transistor SST1 of the third group G3 may be turned off.

Thus, threshold voltages of the programmed third string selection transistors SST3 may increase, and the programmed third string selection transistors SST3 may have positive threshold voltages. The programmed third string selection transistors SST3 may correspond to, e.g. serve as, switching devices. Non-programmed third string selection transistors SST3 may be in a turn-on state because the non-programmed third string selection transistors SST3 may have negative threshold voltages.

As described above, in some example embodiments, the first string selection transistor SST1 of the third group G3, the second string selection transistor SST2 of the first group G1, and the third string selection transistor SST3 of the second group G2 may be programmed, respectively.

In some example embodiments, orders of the programming may be changed. That is, after the programming steps described with reference to FIGS. 5 and 6, the second string selection transistor of the second group G2 may be programmed, and then the third string selection transistor of the first group G1 may be programmed. In this case, the first string selection transistor SST1 of the third group G3, the second string selection transistor SST2 of the second group G2, and the third string selection transistor SST3 of the first group G1 may be programmed, respectively.

As described above, the vertical semiconductor device may include string selection transistors that may be selectively programmed and may be stacked in a plurality of layers. Although the number of channel structures arranged in the second direction may be increased, the cell string corresponding to each channel structure may be selected by the string selection transistors. As the number of channel structures arranged in the second direction is increased, the width of the stacked structure in the second direction may be increased. Therefore, even if a height of the stacked structure is increased, the aspect ratio of the stacked structure may be reduced. The stacked structure may have a stable structure.

Further, the vertical semiconductor device may have a sacrificial pattern between some gate patterns in the second direction included in the stacked structure. Some of the channel structures may pass through the sacrificial pattern.

FIGS. 8 to 18 are cross-sectional views and plan views illustrating stages of a method of manufacturing a vertical semiconductor device in accordance with some example embodiments.

Figure 8:
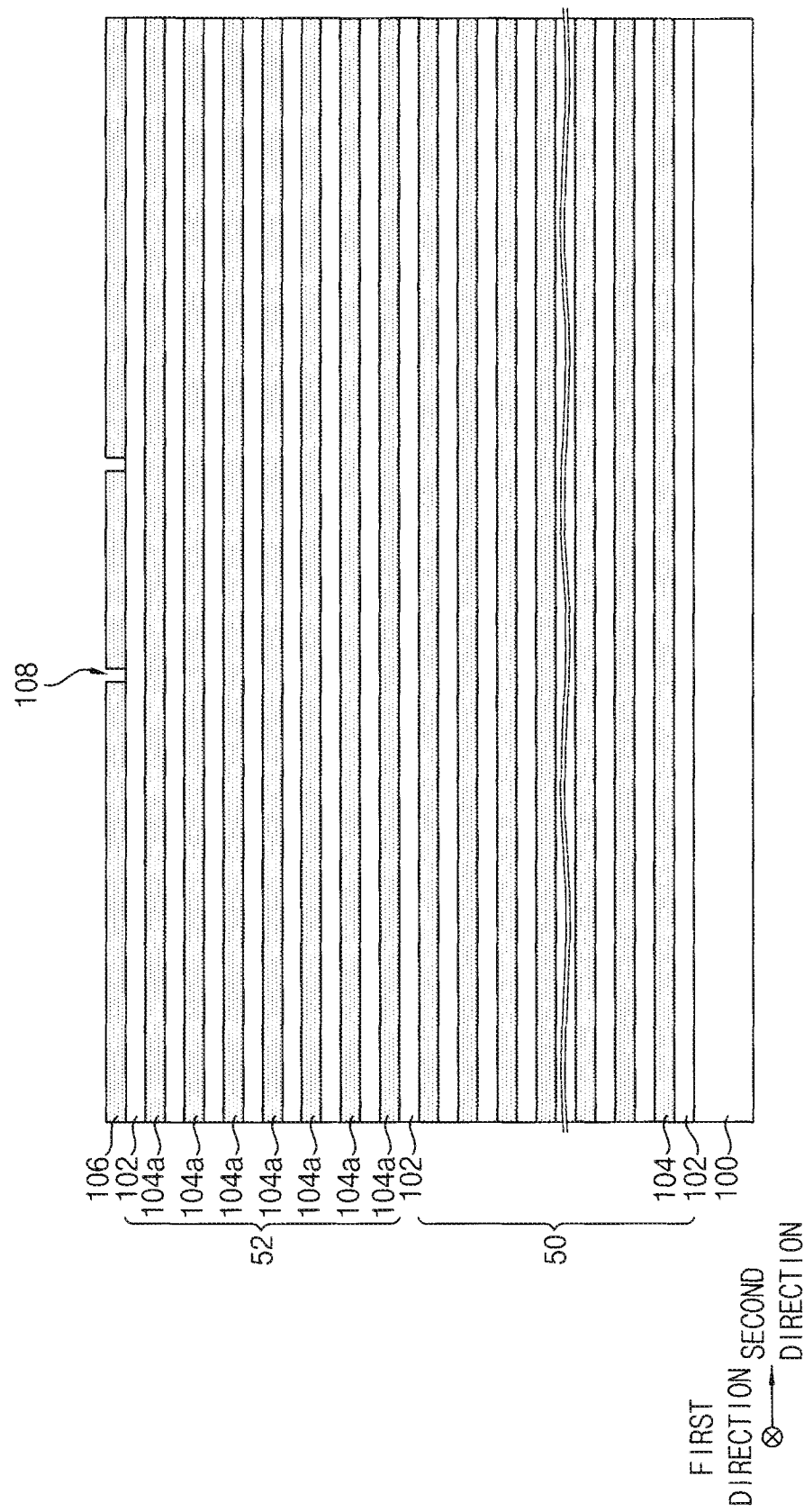
Figure 9:
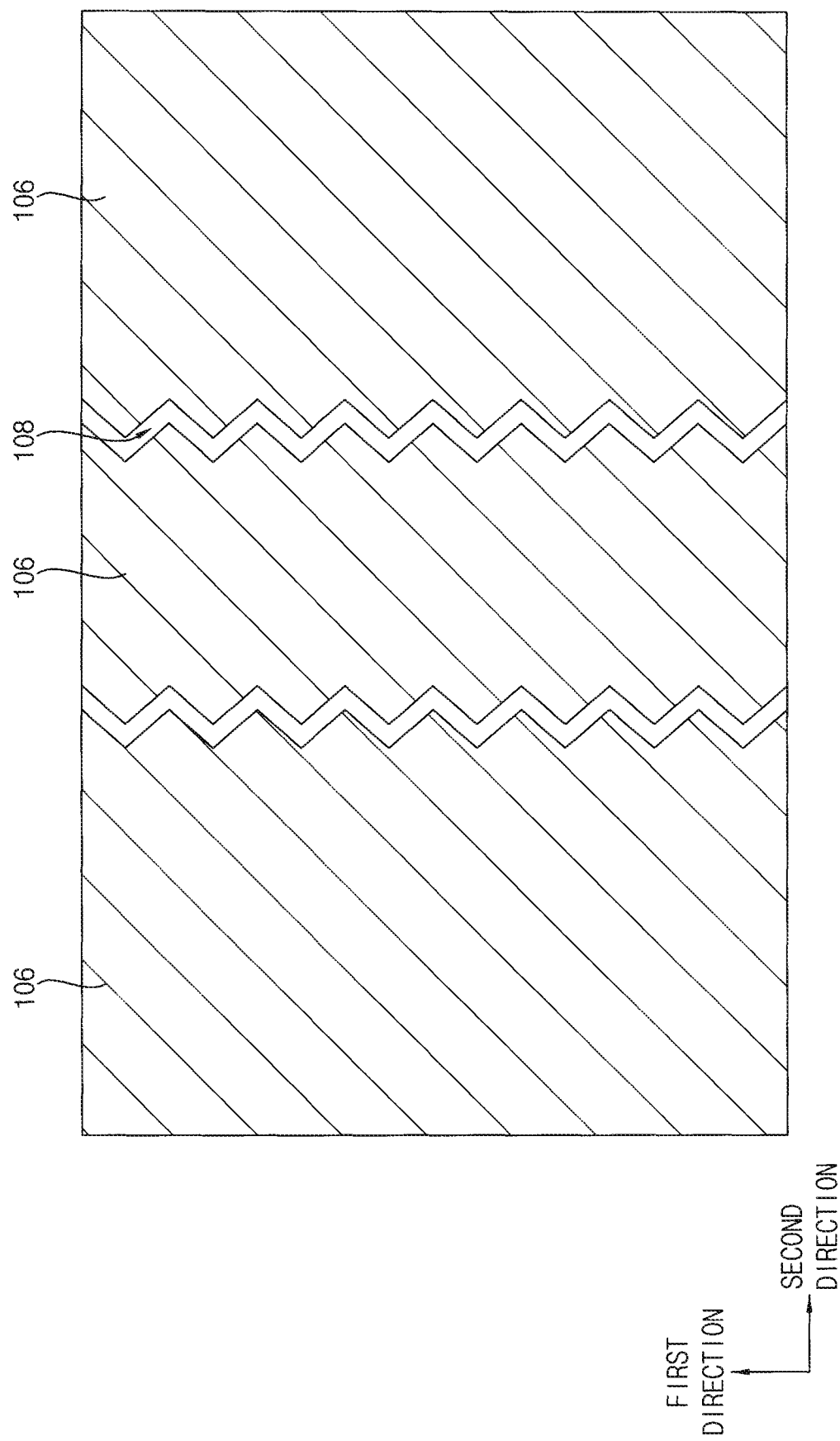
Figure 10:
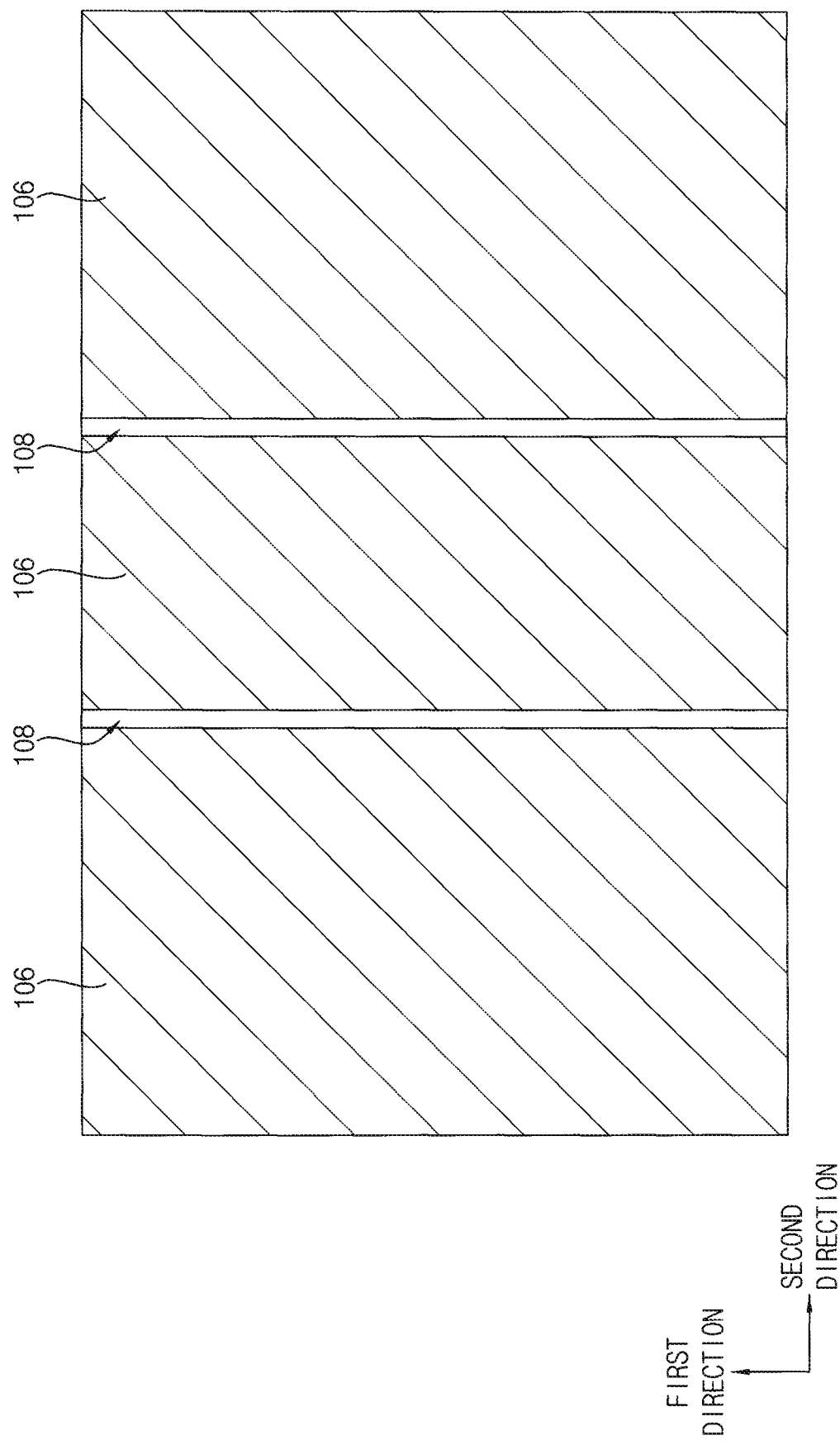

Referring to FIGS. 8 to 10, insulation layers 102 and first sacrificial layers may be alternatelyand repeatedly formed on a substrate 100. Thus, a first mold structure 50 may be formed on the substrate 100. Second sacrificial layers 104a and the insulation layers 102 may be alternately and repeatedly stacked on the first mold structure 50 to form the second mold structure 52. One of the insulation layers 102 may be formed at an upper most surface of each of the first mold structure 50 and the second mold structure 52. Preliminary third sacrificial patterns 106 may be formed on the second mold structure 52.

The first sacrificial layers 104 included in the first mold structure 50 may be replaced with a conductive material through a subsequent process, so that gate patterns of the ground selection transistor and the cell transistor may be formed. The second sacrificial layers 104a included in the second mold structure 52 may be replaced with a conductive material through a subsequent process, so that a gate pattern of the string selection transistor may be formed. In addition, some of the preliminary third sacrificial pattern patterns 106 may be replaced with a conductive material through a subsequent process, so that a gate pattern of the upper selection transistor may be formed.

In some example embodiments, the insulation layers 102 may include an oxide, for example, silicon oxide. The first sacrificial layer 104, the second sacrificial layer 104*a* and the preliminary third sacrificial pattern 106 may include a same material having a high etch selectivity with respect to the insulation layer 102. The first sacrificial layer 104, the second sacrificial layer 104*a*, and the preliminary third sacrificial pattern 106 may include a nitride, for example, silicon nitride, and may not include an oxide, for example, may not include silicon oxide.

In some example embodiments, the plurality of preliminary third sacrificial patterns 106 may extend in the first direction. A first trench 108 may be formed between the preliminary third sacrificial pattern patterns 106. Neighboring preliminary third sacrificial pattern patterns 106 may be separated from each other by the first trench 108. In some example embodiments, the first trench 108 may extend in a first direction.

In some example embodiments, as shown in FIG. 9, the first trench 108 may extend in a zig-zag fashion. In some example embodiments, as shown in FIG. 10, the first trench 108 may extend in a straight line shape.

In some example embodiments, the cell strings may be divided into a plurality of groups by the preliminary third sacrificial pattern 106. The first trench 108 may be formed between channel structures subsequently formed.

Figure 11:
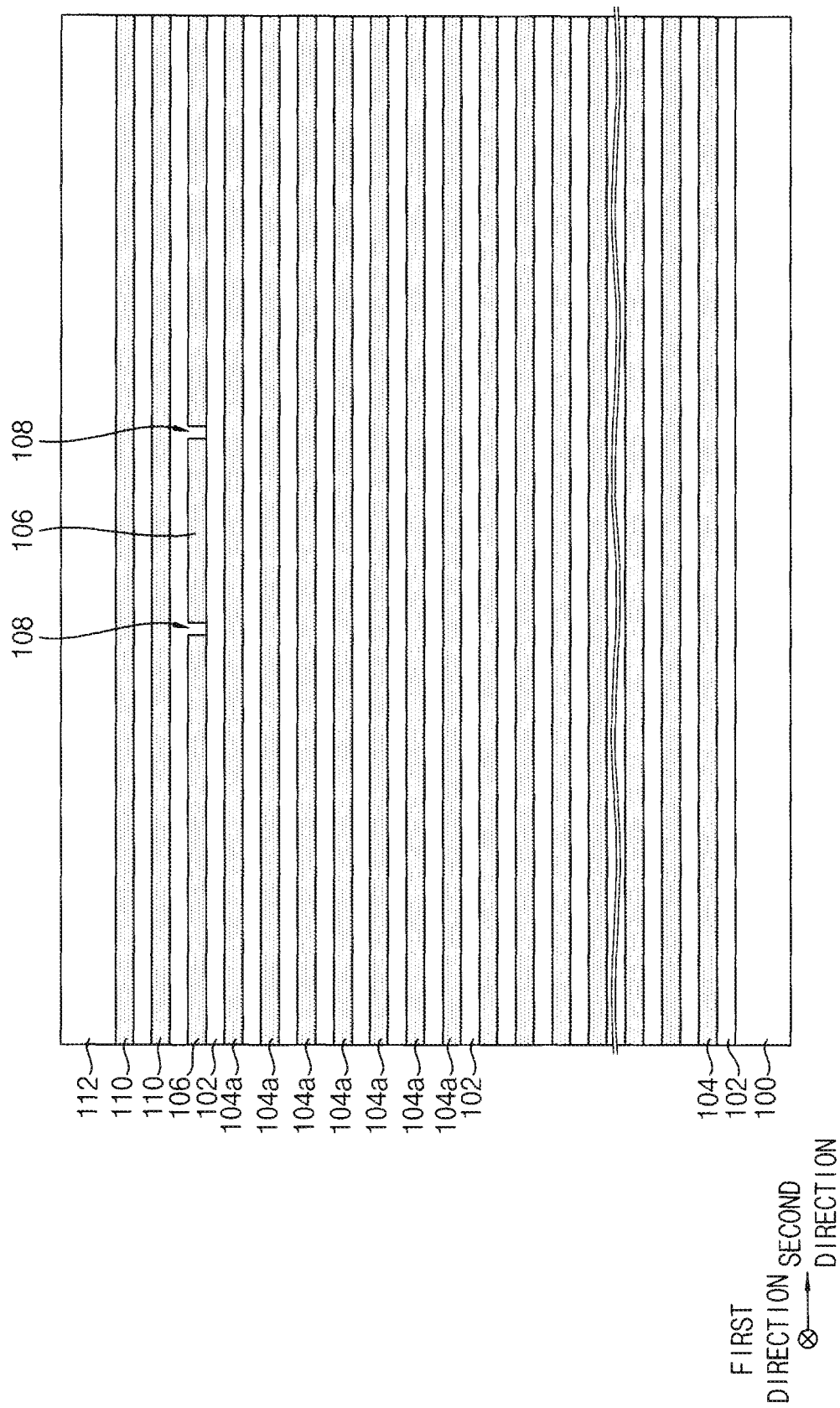

Referring to FIG. 11, the insulation layers 102 and the fourth sacrificial layers 110 may be alternately and repeatedly stacked on the preliminary third sacrificial pattern 106. The insulation layer 102 contacting the preliminary third sacrificial pattern 106 may fill the first trench 108. The upper insulation layer 112 may be formed on an uppermost fourth sacrificial layer 110.

The fourth sacrificial layer 110 may be replaced with a conductive material through a subsequent process. Thus, a gate pattern of the upper transistor may be formed. In some example embodiments, the fourth sacrificial layer 110 may be stacked one or more layers high in the vertical direction. In some example embodiments, the upper transistor may not be formed. In this case, the fourth sacrificial layer 110 may not be formed.

The insulation layers 102 and the upper insulation layer 112 may include an oxide, for example, silicon oxide, and may not include a nitride, for example may not include silicon nitride. The fourth sacrificial layer 110 may include a nitride such as silicon nitride, and may not include an oxide, for example may not include silicon oxide.

Figure 12:
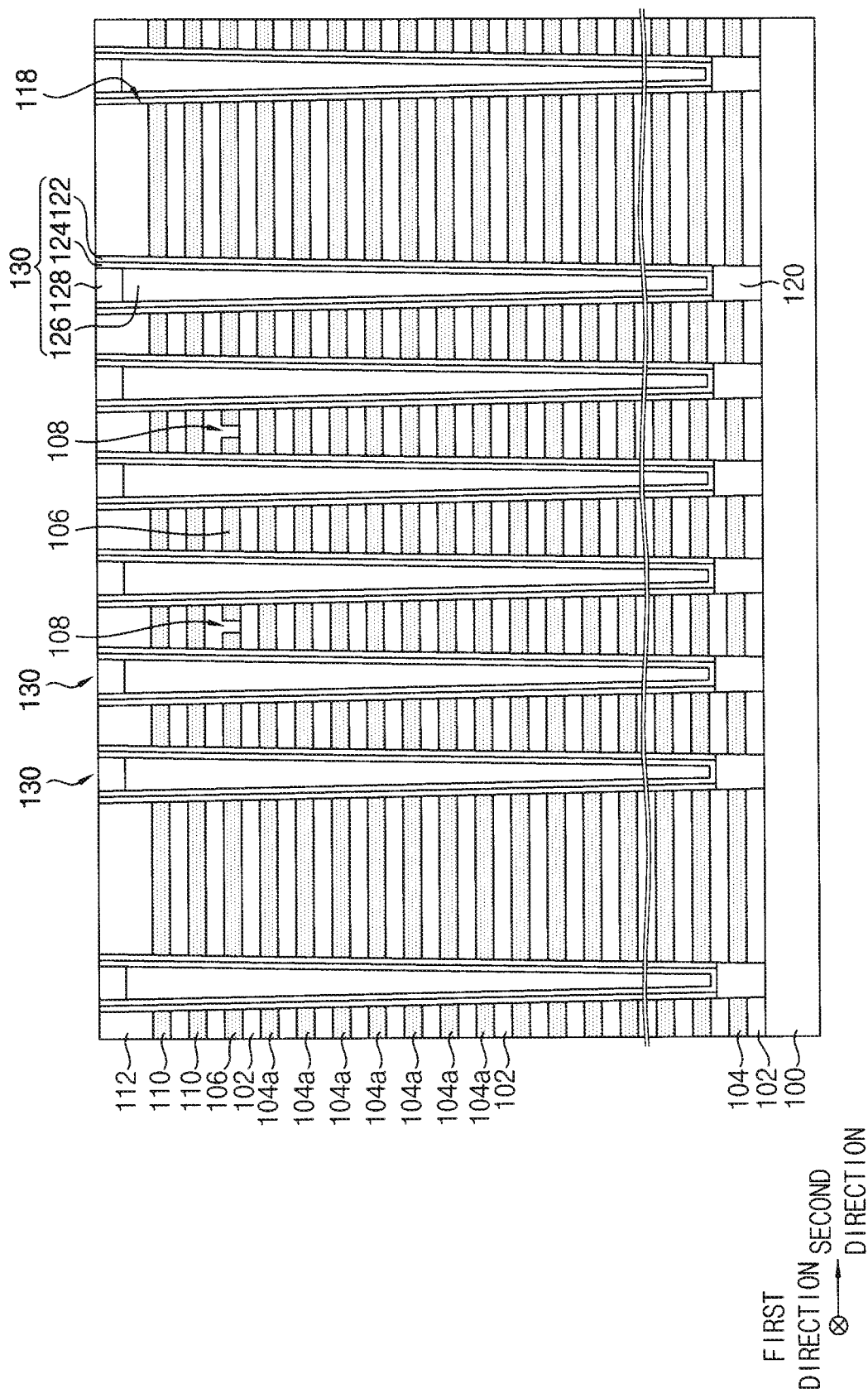
Figure 13:
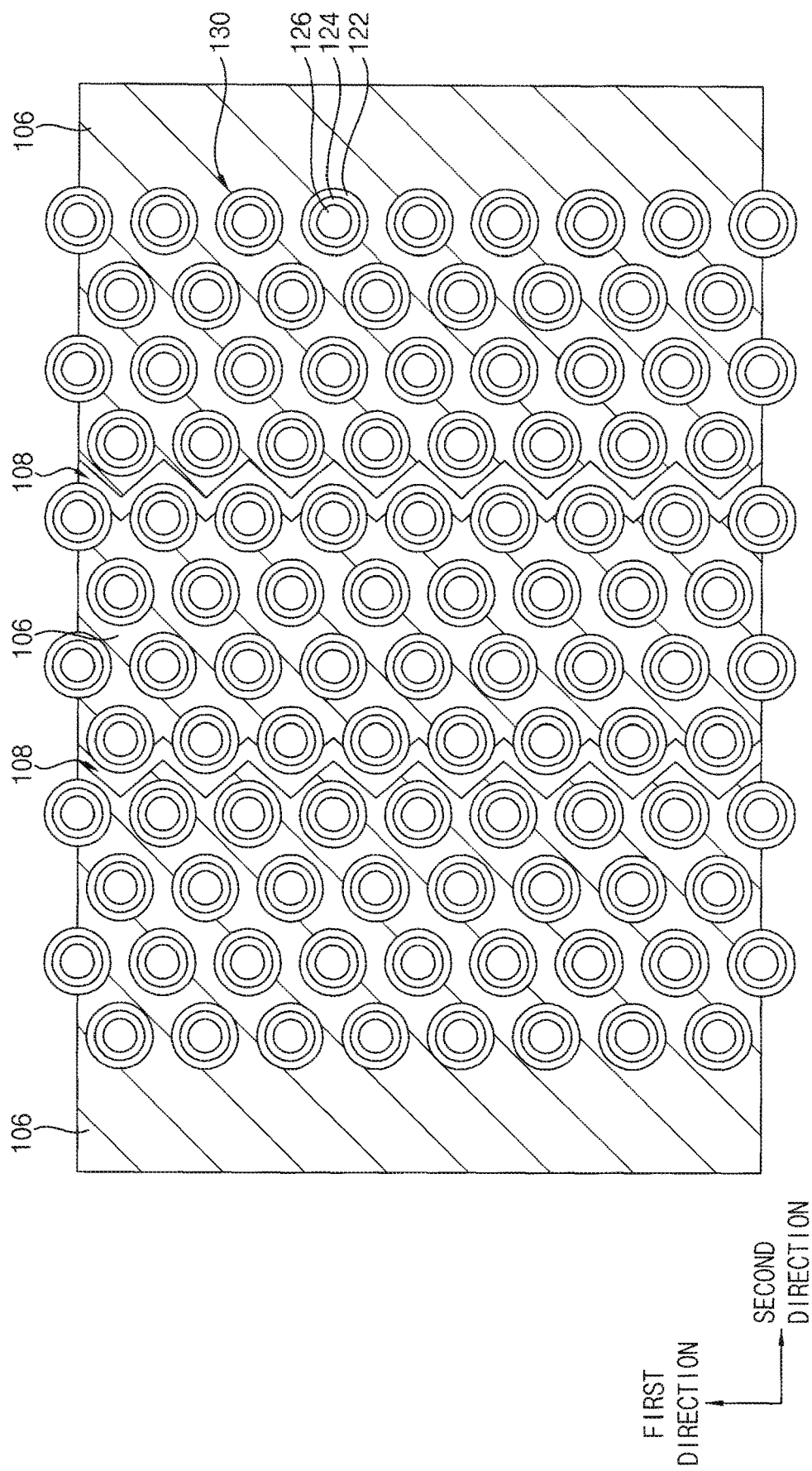

Referring to FIGS. 12 and 13, channel holes 118 may be formed through the upper insulation layer 112, the insulation layers 102, the fourth sacrificial layers 110, the preliminary third sacrificial pattern 106, the second sacrificial layer 104*a*, and the first sacrificial layers 104 by an etching process, e.g. an anisotropic etching process. The channel holes 118 may expose a surface of the substrate 100.

A channel structure 130 including a charge storage structure 122, a channel 124, a filling insulation pattern 126, and an upper conductive pattern 128 may be formed in the channel hole 118.

The charge storage structure 122 may include a blocking layer, a charge storage layer, and a tunnel insulation layer that may be sequentially stacked on a sidewall of the channel hole 118, e.g. may be stacked conformally and sequentially on the sidewall of the channel hole 118. For example, the blocking layer, the charge storage layer, and the tunnel insulation layer may include silicon oxide, silicon nitride, and silicon oxide, respectively. The charge storage structure 122 may be formed with a chemical vapor deposition (CVD) process, for example an atomic layer deposition (ALD) process; however, inventive concepts are not limited thereto. The channel 124 may be electrically connected to the substrate 100. The channel 124 may have a cylindrical shape. The filling insulation pattern 126 may be formed on the channel 124 to fill most of remaining portion of the channel hole 118. The upper conductive pattern 128 may be formed on the filling insulation pattern 126, and the upper conductive pattern 128 may contact an upper sidewall of the channel 124.

In some example embodiments, a semiconductor pattern 120 may be further formed on the bottom surface of the channel hole 118. The semiconductor pattern 120 may contact the substrate 100. A bottom of the channel 124 may contact the semiconductor pattern 120. In some example embodiments, a channel connection pattern (not shown) may be formed to contact a lower portion of the channel 124 and the substrate 100. The channel 124 and substrate 100 may be electrically connected by the channel connection pattern. In some example embodiments, a bottom of the channel 124 may directly contact the substrate 100.

Figure 14:
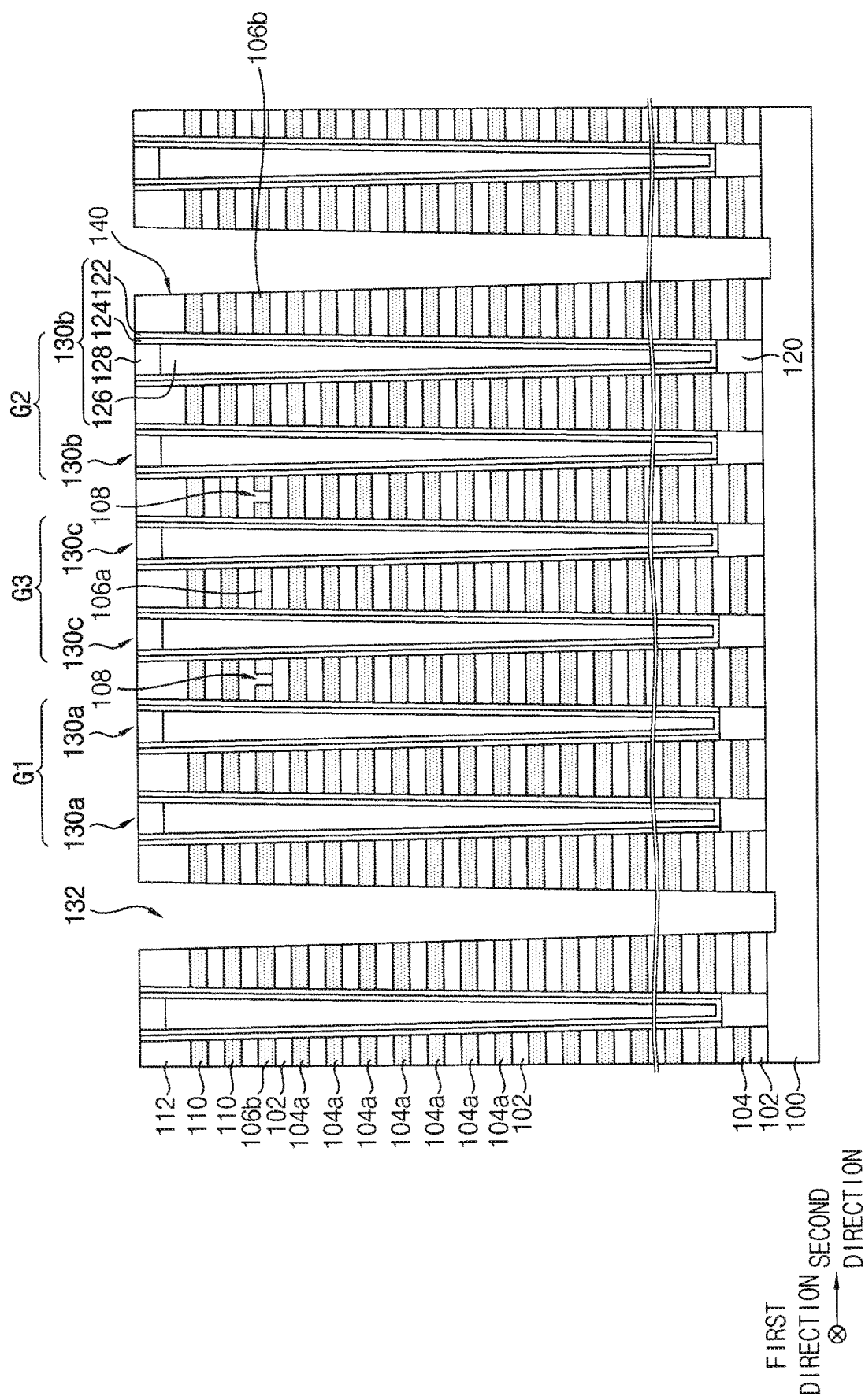
Figure 15:
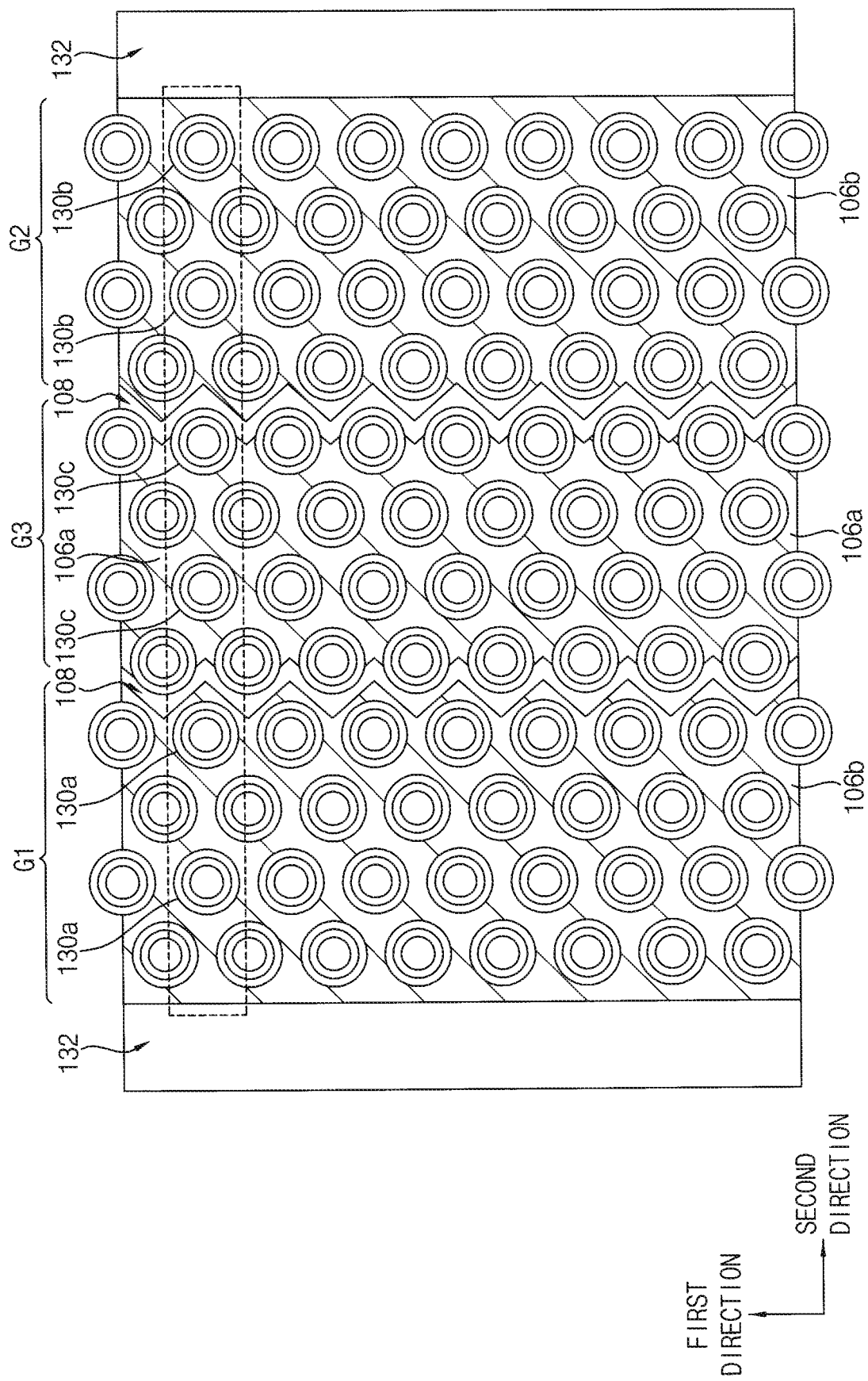

Referring to FIGS. 14 and 15, a second trench 132 may be formed through the upper insulation layer 112, the insulation layer 102, the fourth sacrificial layer 110, the preliminary third sacrificial pattern 106, the second sacrificial layer 104*a*, and the first sacrificial layers 104 by an etching process, e.g. an anisotropic etching process. The second trench 132 may expose the surface of the substrate 100. The second trenches 132 may extend in a first direction.

As the second trench is formed, mold structures may be formed to include the first sacrificial layer 104, the second sacrificial layer 104*a*, the preliminary third sacrificial pattern 106, the fourth sacrificial layer 110, the insulation layer 102 and an upper insulation layer 112. Each of the mold structures 140 may extend in the first direction.

The plurality of channel structures 130*a*, 130*b*, and 130*c* may pass through the mold structure 140. Further, the channel structures 130 may be regularly arranged in the mold structure 140.

In some example embodiments, in a cross-sectional view cut along in the second direction of the mold structure, six channel structures 130*a*, 130*b*, and 130*c* may be disposed in the mold structure 140. The channel structures may include a first channel structure 130*a*, a second channel structure 130*b*, and a third channel structure 130*c*.

Each of the channel structures 130 may correspond to, e.g. serve as, a cell string through a subsequent process. The mold structure 140 may include a first end and a second end to be faced each other in the second direction. Two first channel structures 130*a* of a first group G1 may be adjacent to the first end, and two second channel structures 130*b* of a second group G2 may be adjacent to the second end. Two third channel structures 130*c* of the third group may be between the first and second groups G1 and G2.

The first to third channel structures 130*a*, 130*b*, and 130*c* may pass through respective preliminary third sacrificial patterns separated from each other. Hereinafter, the first and second channel structures 130*a* and 130*b* may pass through a preliminary third sacrificial pattern, which is referred to as an edge third sacrificial pattern 106*b*. The third channel structures 130c may pass through the third sacrificial pattern, which is referred to as an intermediate sacrificial pattern 106a.

Figure 16:
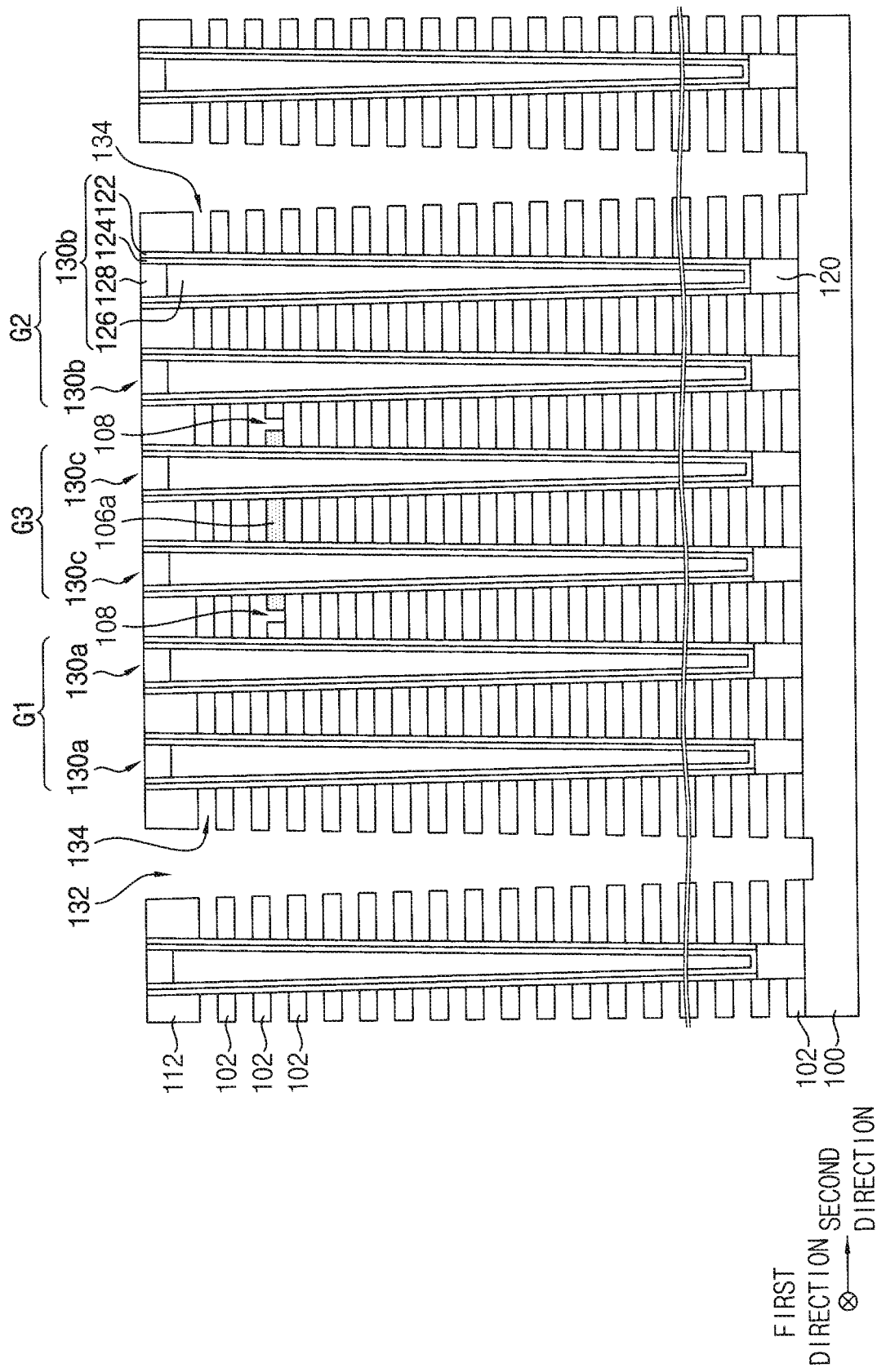

Referring to FIG. 16, the first sacrificial layers 104, the second sacrificial layers 104a, the edge third sacrificial patterns 106b, and the fourth sacrificial layers 104b exposed by the sidewalls of the second trenches 132 may be removed by etching, e.g. isotropic etching, so that first gaps 134 may be formed between the insulation layers 102 of respective layers. Portions of outer walls of the channel structures 130a, 130b, and 130c may be exposed by the first gap 134. For example, the blocking pattern of the charge storage structure 122 may be exposed by the first gap 134.

Removing of the first sacrificial layer 104, the second sacrificial layer 104a, the edge third sacrificial pattern 106b, and the fourth sacrificial layer 110 may be performed by an etching process, e.g. a wet etching process. For example, the first sacrificial layers 104, the second sacrificial layers 104a, the edge third sacrificial patterns 106b, and the fourth sacrificial layers 110 are removed by wet etchant introduced through the second trenches 132. Chemicals used in the wet etching process may include, for example, at least one of hydrogen fluoride, phosphoric acid, or hydrogen sulfide; however, inventive concepts are not limited thereto.

A sidewall of the edge third sacrificial pattern 106b may be exposed by the second trench 132. However, as the intermediate sacrificial pattern 106a is separated from the edge third sacrificial pattern 106b by the first trench 108, the intermediate sacrificial pattern 106a may not be in communication with the second trench 132. Therefore, the wet etchant may not be introduced into the intermediate sacrificial pattern 106a, so that the intermediate sacrificial pattern 106a may not be removed in the etching process.

Figure 17:
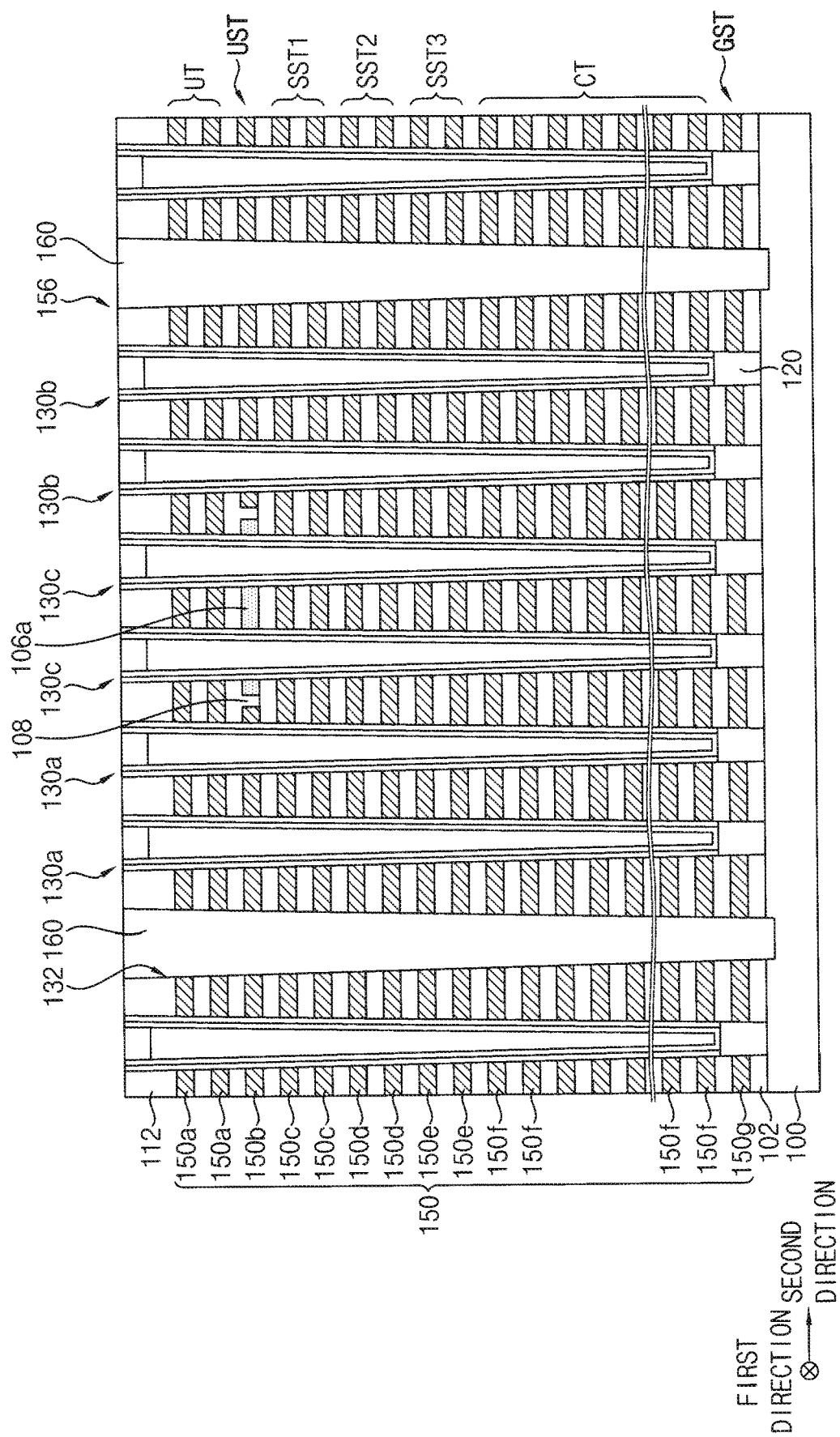

Referring to FIG. 17, a second blocking layer (not shown) may be conformally formed on the surfaces of the second trench 132 and the first gaps 134, and a gate electrode layer may be formed on the second blocking layer to fill the first gap 134.

In some example embodiments, the gate electrode layer may include barrier layer (not shown) and a gate conductive layer sequentially stacked. The gate conductive layer may include a metal having low electrical resistance such as at least one of tungsten, titanium, tantalum, and platinum, etc., and the barrier layer may include a metal nitride such as at least one of tungsten nitride, titanium nitride, tantalum nitride, etc.

Thereafter, the gate electrode layer may be partially removed. Thus, gate patterns 150 may be formed in the first gaps 134. In some example embodiments, the gate electrode layer formed in the second trenches 132 may be removed. The removal process may include a wet etching process. The gate pattern 150 may extend in the first direction.

Thereafter, an insulation pattern 160 may be formed in the second trench 132.

As described above, a stacked structure 156 including the gate patterns 150 stacked may be formed to extend in the first direction. The intermediate sacrificial pattern 106a may remain in the stacked structure 156.

Figure 18:
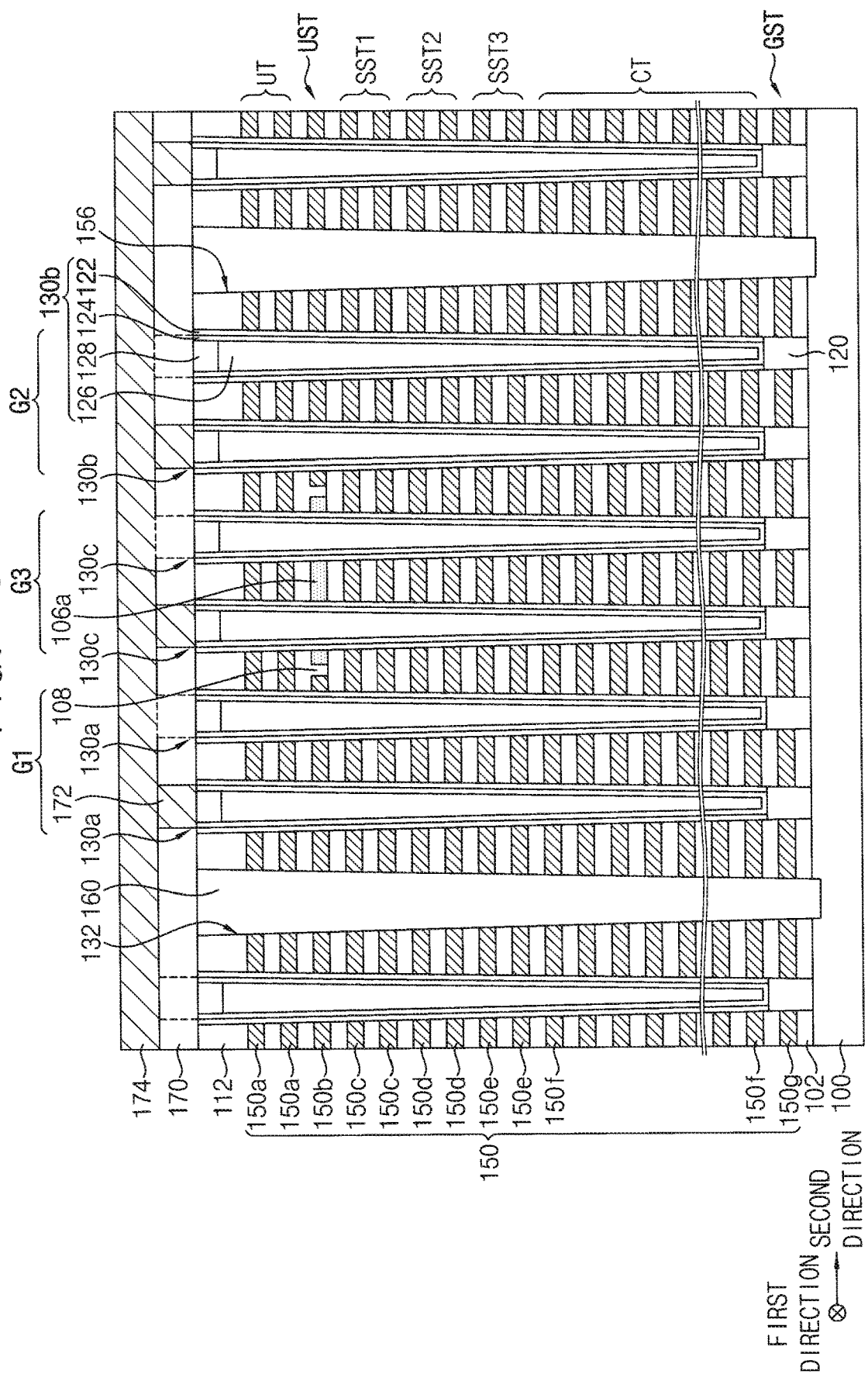

Referring to FIG. 18, a first insulating interlayer 170 may be formed on the stacked structure 156 and the insulation pattern 160. A bit line contact 172 may be formed through the first insulating interlayer 170, and the bit line contact 172 may be electrically connected to the upper conductive pattern 128. Further, bit lines 174 extending in the second direction may be formed on the first insulating interlayer 170 and the bit line contact 172.

In some example embodiments, two bit lines, i.e., first and second bit lines, may be formed on the six channel structures 130a, 130b, and 130c arranged in the second direction. For example, the first bit line may extend in the second direction so as to contact upper surfaces of odd-numbered channel structures. Further, the second bit line may extend in the second direction so as structure contact upper surfaces of even-numbered channel structures.

As described above, the plurality of channel structures 130a, 130b, and 130c may pass through the stacked structure 156. In addition, some of the channel structures 130a, 130b, and 130c may be formed through the intermediate sacrificial pattern 106a included in the stacked structure 156.

Thereafter, the string selection transistors disposed under the intermediate sacrificial pattern 106a may be selectively programmed. The programming process may be the same as that illustrated with reference to FIGS. 4 to 7.

Thus, each of the programmed string selection transistors may have a target positive threshold voltage. A desired one cell string may be selected by the first and second bit lines and the programmed string selection transistor.

Figure 19:
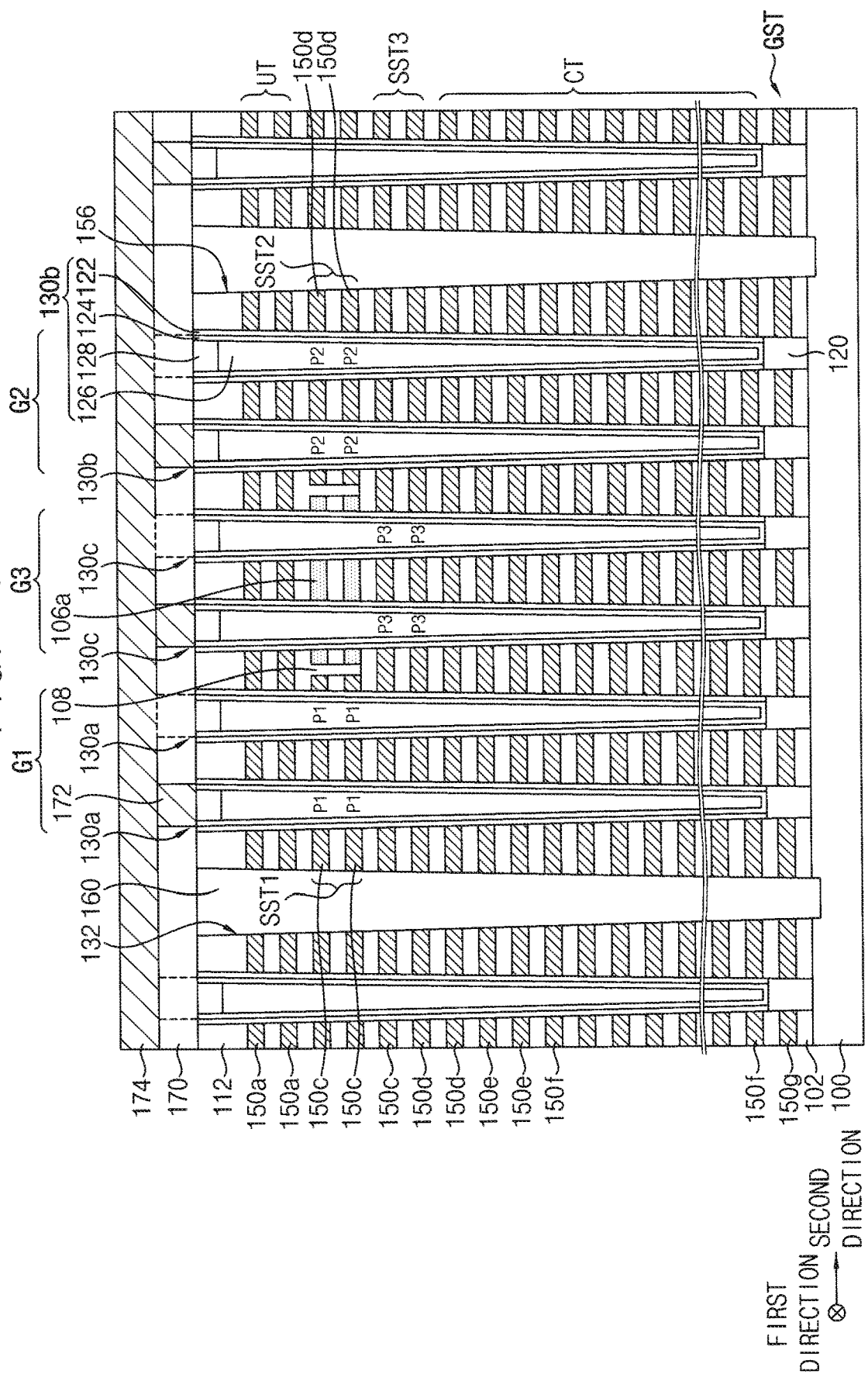
Figure 20:
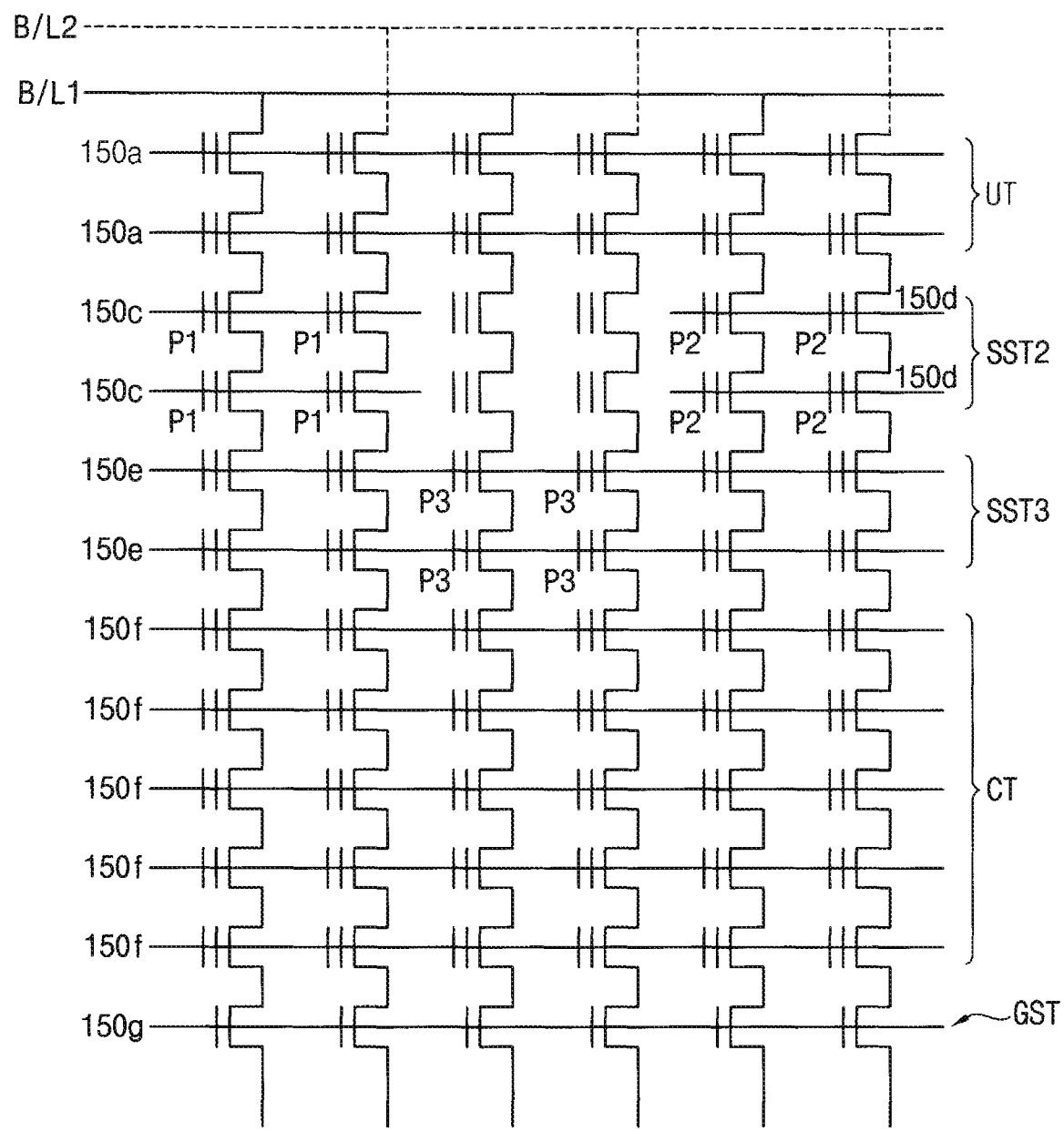

FIGS. 19 and 20 are a cross-sectional view and a circuit diagram illustrating a vertical semiconductor device in accordance with some example embodiments, respectively.

As opposed to FIG. 1, the vertical semiconductor device may not include the upper selection transistor UST. Further, the intermediate sacrificial pattern may be disposed between some of the string selection transistors. In the vertical semiconductor device, the cell transistor, the ground selection transistor, the upper transistor, and the upper wirings may be substantially the same as those illustrated with reference to FIG. 1.

Referring to FIGS. 19 and 20, the vertical semiconductor device includes the stacked structure 156 formed on the substrate 100 and the channel structures 130a, 130b and 130c passing through the stacked structure 156.

The stacked structure 156 may include the intermediate sacrificial pattern 106a and some of the channel structure may pass through the intermediate sacrificial pattern 106a.

The stacked structure 156 may include a first portion positioned at a lower portion and a second portion above the first portion. The gate patterns 150g, 150f, 150e included in a ground selection transistor GST, cell transistors CT, and some of string selection transistors SST3 may be formed in the first portion of the stacked structure 156. The gate patterns 150d, 150c, 150a included in other string selection transistors SST1 and SST2 and the upper transistor UT may be formed in the second portion of the stacked structure 156. In some example embodiments, the upper transistors UT may not be formed.

In some example embodiments, the string selection transistors SST1 and SST2 disposed at a lowermost portion of the second portion of the stack structure 156 may include gate patterns 150c and 150d separated from each other. Further, the intermediate sacrificial pattern 106a may be formed between the separated gate patterns 150c and 150d in the second direction. For example, the string selection transistors SST1 and SST2 disposed on both sides of the intermediate sacrificial pattern 106a may be electrically isolated from each other.

In some example embodiments, the string selection transistor SST3 may further be disposed under the intermediate sacrificial pattern 106a.

The channel structures 130a, 130b, and 130c may extend to the upper surface of the substrate 100 through the stacked structure 156. The channel structure may be divided into a first channel structure 130a, a second channel structure 130b, and a third channel structure 130c according to positions of the channel structures in the stacked structure 156.

In some example embodiments, the first channel structure 130a may pass through a gate pattern adjacent to a first side of the intermediate sacrificial pattern 106a, and the second channel structure 130b may pass through a gate pattern adjacent to a second side of the intermediate sacrificial pattern 106a. The third channel structure 130c may pass through the intermediate sacrificial pattern 106a.

As shown in FIG. 19, the first string selection transistor SST1 and a second string selection transistor SST2 may be disposed on both sides of the intermediate sacrificial pattern 106a, respectively. The first and second string selection transistors SST1 and SST2 may be located at the same level. Further, the third string selection transistor SST3 may be located under the intermediate sacrificial pattern.

Each of the first and second string selection transistors SST1 and SST2 may be programmed to have a positive threshold voltage. Further, the third string selection transistors SST3 disposed to face a lower surface of the intermediate sacrificial pattern 106a may be programmed, so that the third string selection transistors SST3 may have positive threshold voltages.

Hereinafter, a programming of each string selection transistor may be described.

First, the first and second string selection transistors SST1 and SST2 adjacent to both sides of the intermediate sacrificial pattern 106a may be programmed (see P1, P2). Therefore, threshold voltages of the first and second string selection transistors SST1, SST2 may increase, and the first and second string selection transistors SST1, SST2 may have positive threshold voltages, respectively. The first and second string selection transistors SST1 and SST2 may correspond to, e.g. serve as, switching devices.

Next, the third string selection transistors SST3 opposed to the lower surface of the intermediate sacrificial pattern may be programmed (see P3). The second string selection transistors SST1 and SST2 may be turned off, and only the third string selection transistors SST3 opposed to the lower surface of the intermediate sacrificial pattern 106a may be selectively programmed.

Thus, threshold voltages of the programmed third string selection transistors SST3 may increase, and the programmed third string selection transistors SST3 may have positive threshold voltages. The programmed third string selection transistors SST3 may correspond to, e.g. serve as, switching devices. Non-programmed third string selection transistors SST3 may be in a turn-on state because the non-programmed third string selection transistors SST3 may have negative threshold voltages.

FIGS. 21 to 24 are cross-sectional views illustrating stages of a method of manufacturing a vertical semiconductor device in accordance with some example embodiments.

Figure 21:
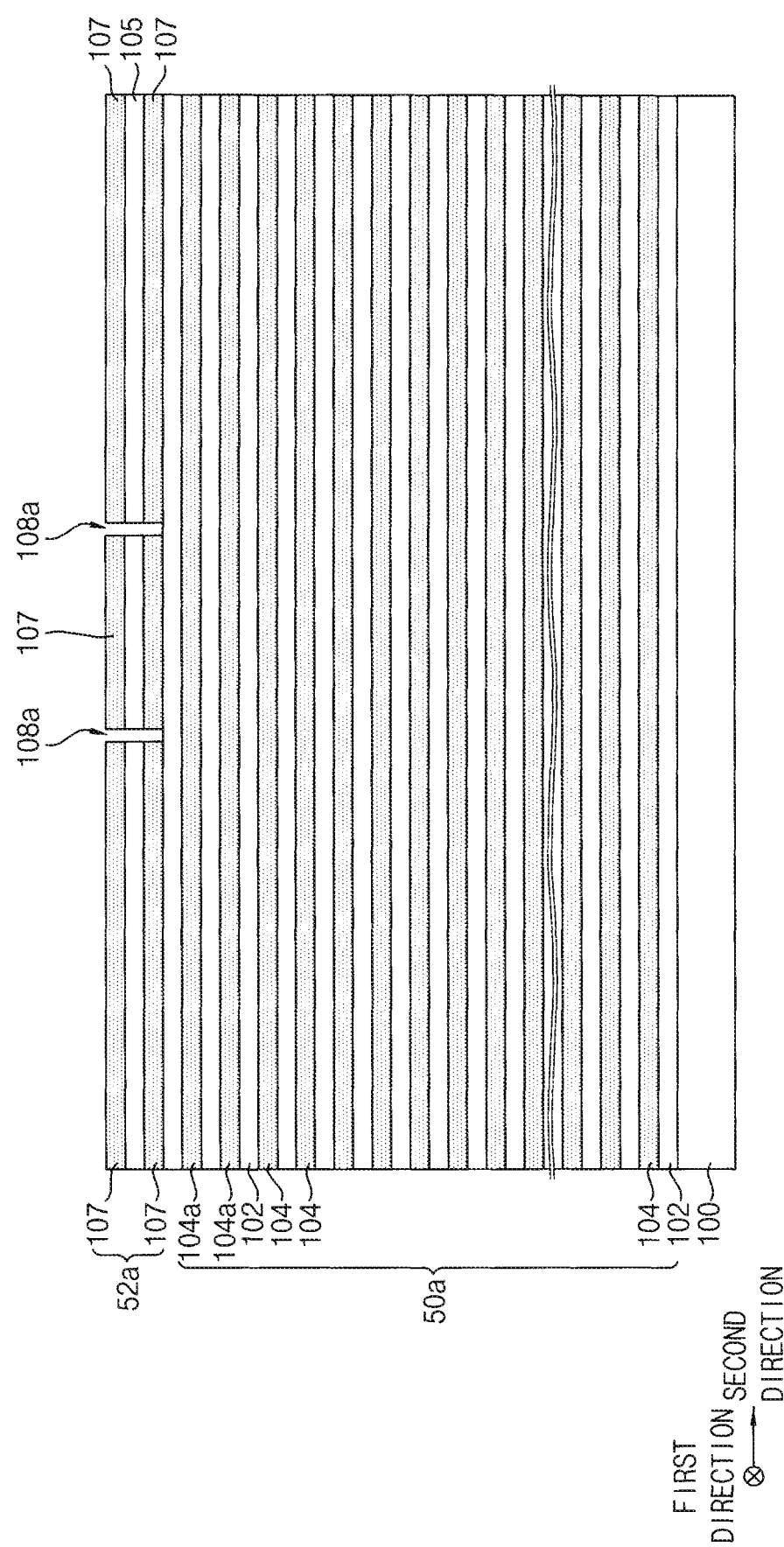

Referring to FIG. 21, insulation layers 102 and first sacrificial layers may be alternately and repeatedly formed on a substrate 100. Thus, a first mold structure 50a may be formed on the substrate 100. A second mold structure 52a including a second sacrificial pattern 107 and an insulation pattern 105 may be formed on the first mold structure 50a.

In some example embodiments, the second sacrificial pattern 107 and the insulation pattern 105 may be repeatedly stacked with one layer or a plurality of layers.

In some example embodiments, the second mold structures 52a may extend in the first direction. A first trench 108a may be formed between the second mold structures 52a. Neighboring second mold structures may be separated from each other by the first trench 108a. In some example embodiments, the first trench 108a may extend in a first direction.

Figure 22:
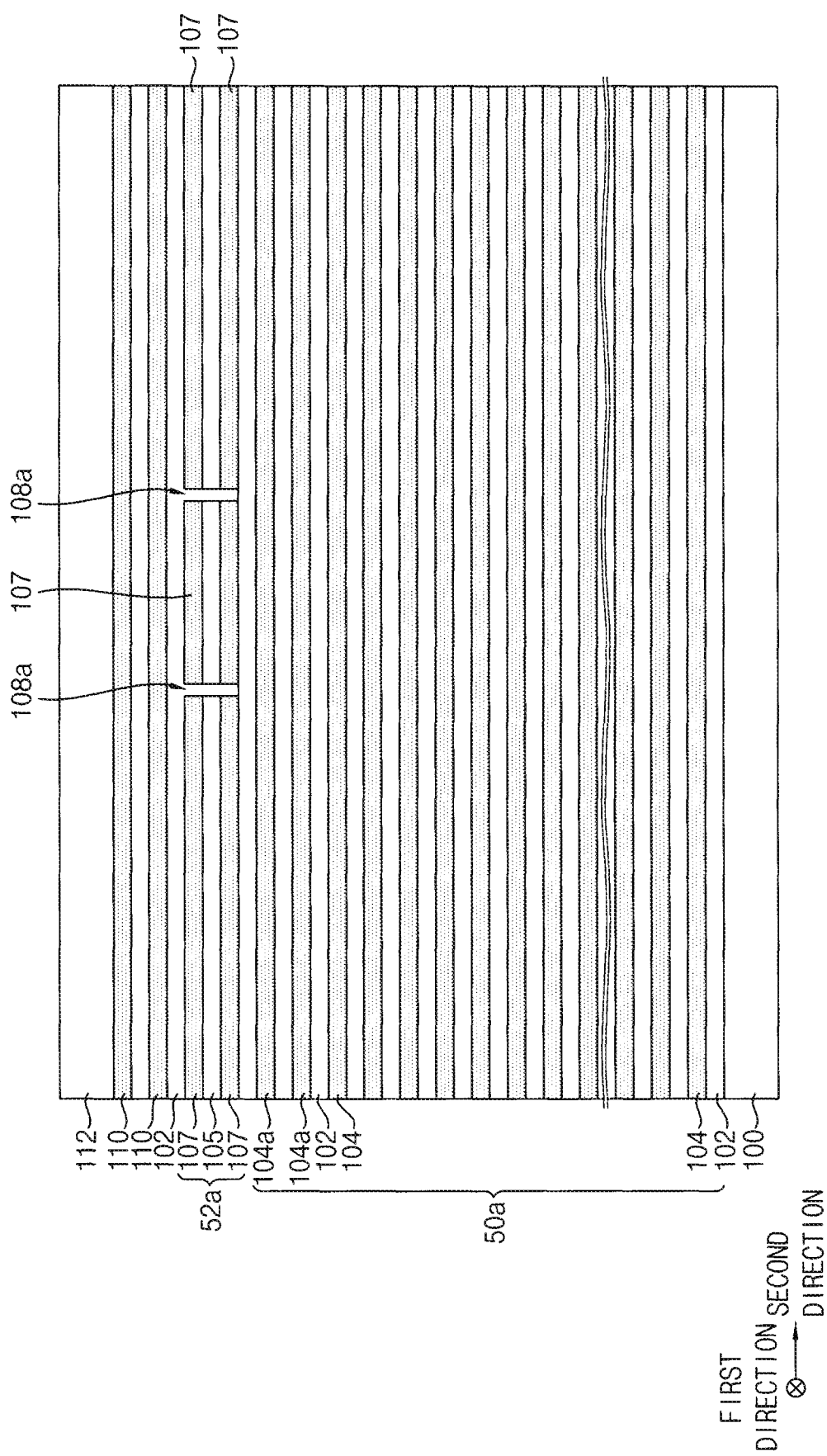

Referring to FIG. 22, the insulation layers 102 and fourth sacrificial layers 110 may be alternately and repeatedly stacked on the second mold structures 52a. One of the insulation layers 102 may fill the first trench 108a. The upper insulation layer 112 may be formed on an uppermost fourth sacrificial layer 110.

Figure 23:
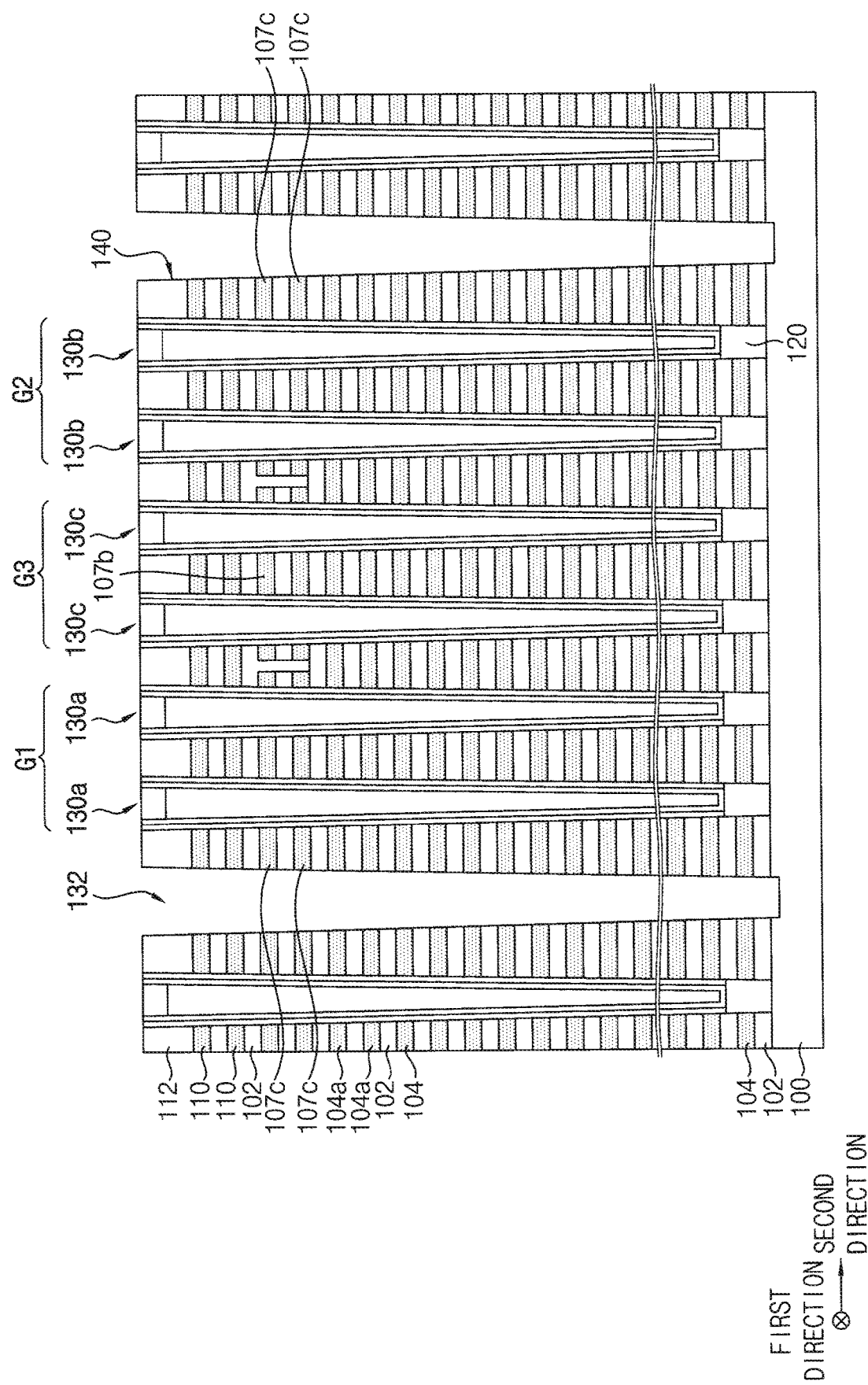

Referring to FIG. 23, the channel structure 130 may be formed through the upper insulation layer 112, the insulation layers 102, the insulation pattern 105, the fourth sacrificial layer 110, the second sacrificial pattern 107 and the first sacrificial layers 104.

Thereafter, the upper insulation layer 112, the insulation layer 102, the insulation pattern 105, the fourth sacrificial layer 110, the second sacrificial pattern 107, and the first sacrificial layers 104 may be etched, e.g. anisotropically etched, to form the second trench exposing an upper surface of the substrate 100. Thus, the second sacrificial patterns 107 may be transformed into the second edge sacrificial patterns 107b and the second intermediate sacrificial pattern 107a.

The processes may be similar to those illustrated with reference to FIGS. 12 to 15.

Figure 24:
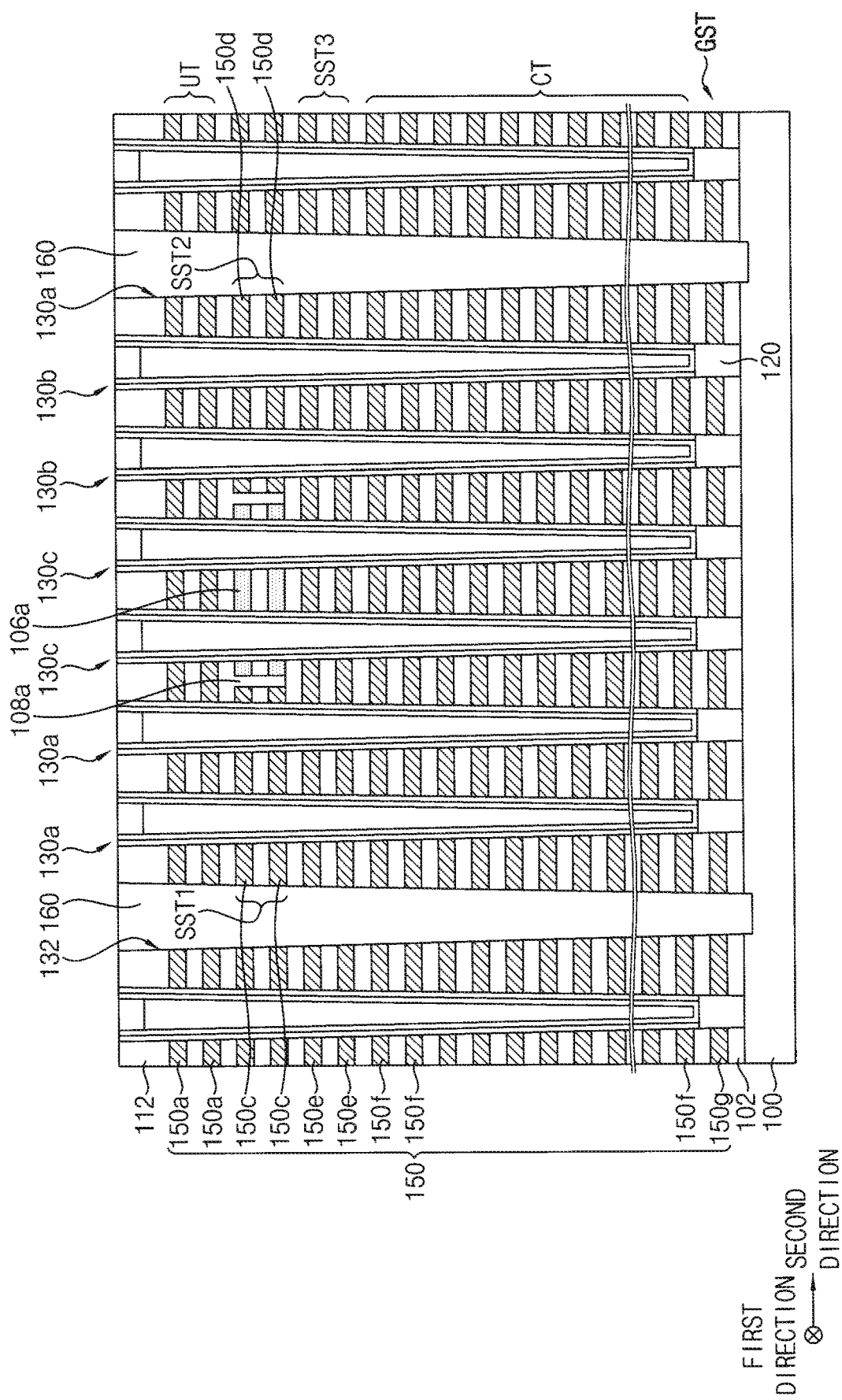

Referring to FIG. 24, the first sacrificial layers 104, the second edge sacrificial patterns 107b, and the fourth sacrificial layer 110 exposed by sidewalls of the second trenches 132 may be removed to form first gaps between the insulation layers 102 of respective layers. In this case, the second intermediate sacrificial pattern 107a may not be removed. The second intermediate sacrificial pattern 107a may be provided as the intermediate sacrificial pattern 106a.

The gate patterns 150 may be formed in the first gaps. The gate patterns 150c and 150d may be disposed on both sides of the intermediate sacrificial pattern 106a. An insulation pattern 160 may be formed to fill the second trench 132.

These processes may be similar to those illustrated with reference to FIGS. 16 and 17.

Referring again to FIG. 19, a first insulating interlayer 170 may be formed on the stacked structure 156 and the insulation pattern 160. A bit line contact 172 may be formed through the first insulating interlayer 170. The bit line contact 172 may be electrically connected to the upper conductive pattern 128. Further, bit lines 174 extending in the second direction may be formed on the first insulating interlayer 170 and the bit line contact 172.

Thereafter, some of selected string selection transistors SST1, SST2, SST3 may be programmed. Therefore, a semiconductor device as shown in FIG. 19 may be manufactured.

Figure 25:
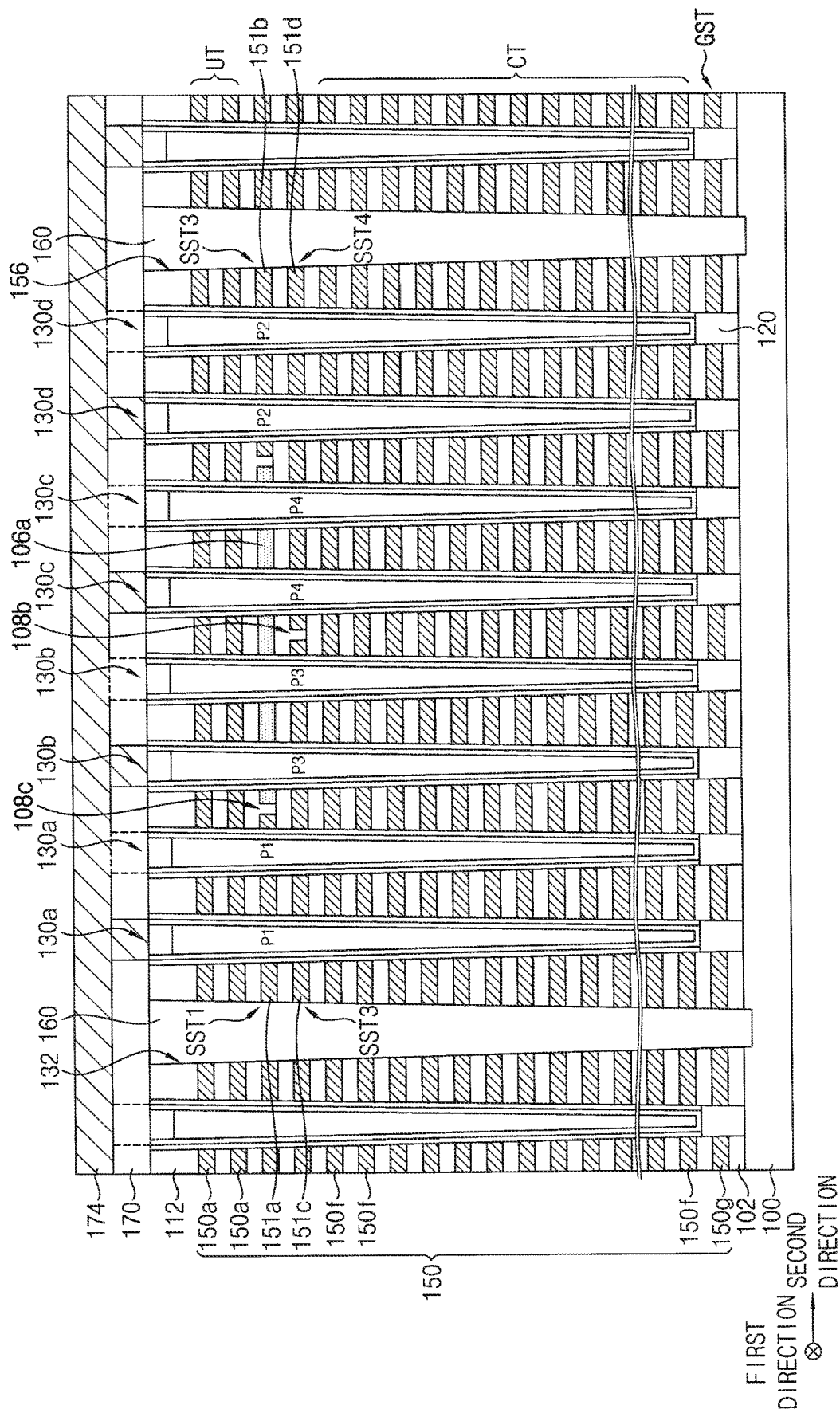
Figure 26:
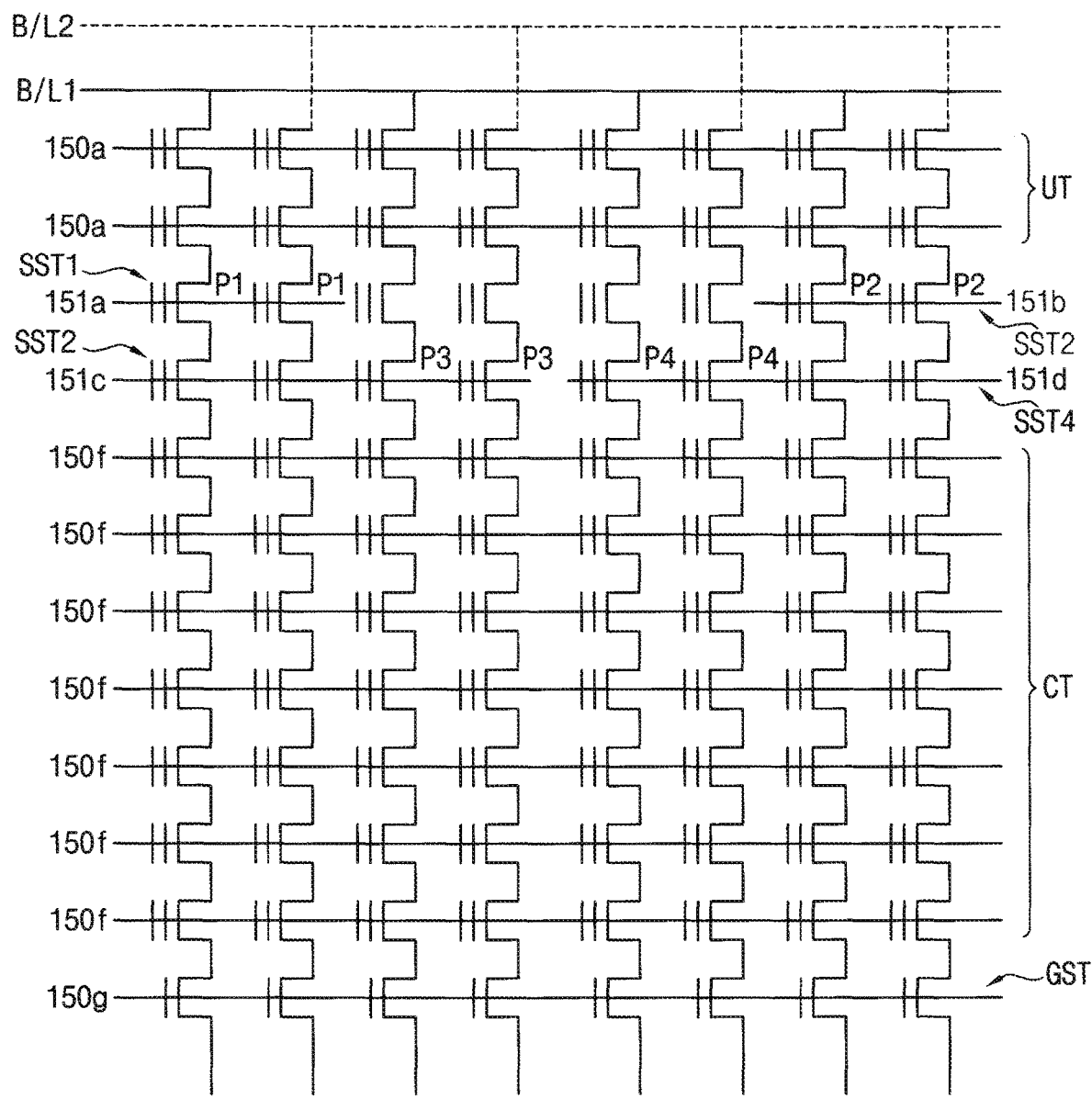

FIGS. 25 and 26 are a cross-sectional view and a circuit diagram illustrating a vertical semiconductor device in accordance with some example embodiments, respectively.

As opposed to FIG. 1, the vertical semiconductor device may not include the upper selection transistor. The intermediate sacrificial pattern may be disposed between some of the string selection transistors. Further, a trench may be formed between some of the string selection transistors. In the vertical semiconductor device, the cell transistor, the ground selection transistor, the upper transistor, and the upper wirings may be substantially the same as those illustrated with reference to FIG. 1.

Referring to FIGS. 25 and 26, the vertical semiconductor device includes the stacked structure 156 formed on the substrate 100 and the channel structures 130a, 130b, 130c and 130d passing through the stacked structure 156.

In a cross-sectional view cut along in the horizontal direction of the stacked structure, the stacked structure 156 may include at least eight channel structures 130a, 130b, 130c and 130d. When the stacked structure has eight channel structures 130a, 130b, 130c and 130d arranged in the second direction and two bit line connecting the eight channel structures 130a, 130b, 130c and 130d, the stacked structure 156 may include at least four string selection transistors. For example, the stacked structure 156 may include first, second, third and fourth string selection transistors SST1, SST2, SST3, and SST4.

The stacked structure 156 may include the intermediate sacrificial pattern 106a. Some of the channel structures 130b may penetrate the intermediate sacrificial pattern 106a.

The stacked structure 156 may include a first portion positioned at a lower portion and a second portion above the first portion. The gate patterns 150g, 150f, 150e, 150d and 150c included in a ground selection transistor GST and cell transistors CT may be formed in the first portion of the stacked structure 156. The gate patterns 151a, 151b, 151c, 151d, 150a included in the string selection transistors SST1, SST2, SST3 and SST4 and the upper transistor UT may be formed in the second portion of the stacked structure 156. In some example embodiments, the upper transistors UT may not be formed.

In some example embodiments, the string selection transistors SST1, SST2, SST3, and SST4 may include gate patterns 151a, 151b, 151c, and 151d being separate from each other. The intermediate sacrificial pattern 106a may be formed between the separated gate patterns 151a and 151b in the second direction. For example, the string selection transistors SST1 and SST2 adjacent to both sides of the intermediate sacrificial pattern 106a may be electrically isolated from each other. A first upper trench 108c may be formed between the intermediate sacrificial pattern 106a and the gate patterns 151a and 151b.

In some example embodiments, the string selection transistors SST3 and SST4 may further be disposed under the intermediate sacrificial pattern 106a. The string selection transistors SST3 and SST4 may include gate patterns 151c and 151d separated by the first lower trench 108b. The first lower trench 108b may be disposed to face a center portion of a lower surface of the intermediate sacrificial pattern 106a.

For example, the first string selection transistor SST1 and the second string selection transistor SST2 may be adjacent to the both sides of the intermediate sacrificial pattern 106a. The first and second string selection transistors SST1 and SST2 may be located at the same level. Further, the third and fourth string selection transistors SST3 and SST4 may be located under the lower surface of the intermediate sacrificial pattern 106a. The first lower trench 108b may be disposed between the third and fourth string selection transistors SST3 and SST4. The third and fourth string selection transistors SST3 and SST4 may be located at the same level.

The channel structures 130a, 130b, 130c, and 130d may extend to the upper surface of the substrate 100 through the stacked structure 156. The channel structure may include first, second, third and fourth channel structures 130a, 130b, 130c, and 130d.

In some example embodiments, the first channel structure 130a may pass through a gate pattern 151a adjacent to a first side of the intermediate sacrificial pattern, and the second channel structure 130b may pass through the intermediate sacrificial pattern 106a and the gate pattern 151d adjacent to the first side of the first lower trench 108b. The third channel structure 130c may pass through the intermediate sacrificial pattern 106a and the gate pattern 151d adjacent to a second side of the first lower trench 108b. The fourth channel structure 130d may pass through the gate pattern 151d adjacent to the second side of the intermediate sacrificial pattern 106a.

The first and second string selection transistors SST1 and SST2 may be programmed to have positive threshold voltages, respectively. Further, the third and fourth string selection transistors SST3 and SST4 opposed to the lower surface of the intermediate sacrificial pattern 106a may be programmed, and the third and fourth string selection transistors SST3 and SST4 may have positive threshold voltages, respectively.

Hereinafter, programming of each string selection transistor may be described.

First and second string selection transistors SST1 and SST2 adjacent to the intermediate sacrificial pattern 106a may be programmed (see P1 and P2). Therefore, threshold voltages of the first and second string selection transistors SST1 and SST2 may increase, and the first and second string selection transistors SST1 and SST2 may have positive threshold voltages. The first and second string selection transistors SST1 and SST2 may correspond to, e.g. serve as, switching devices, respectively.

Next, third and fourth string selection transistors SST1 opposed to the lower surface of the intermediate sacrificial pattern 106a may be programmed (see P3 and P4). For example, the programmed first and second string selection transistors SST1 and SST2 may be turned off, and the third and fourth string selection transistors opposed to the lower surface of the intermediate sacrificial pattern 106a may be selectively programmed.

Therefore, threshold voltages of the programmed third and fourth string selection transistors SST3 and SST4 may increase, and the programmed third and fourth string selection transistors SST3 and SST4 may have positive threshold voltages. The programmed third and fourth string selection transistors SST3 and SST4 may correspond to, e.g. serve as, switching devices. Non-programmed third and fourth string selection transistors SST3 and SST4 may be in a turn-on state because the non-programmed third string selection transistors SST3 may have negative threshold voltages.

Figure 27:
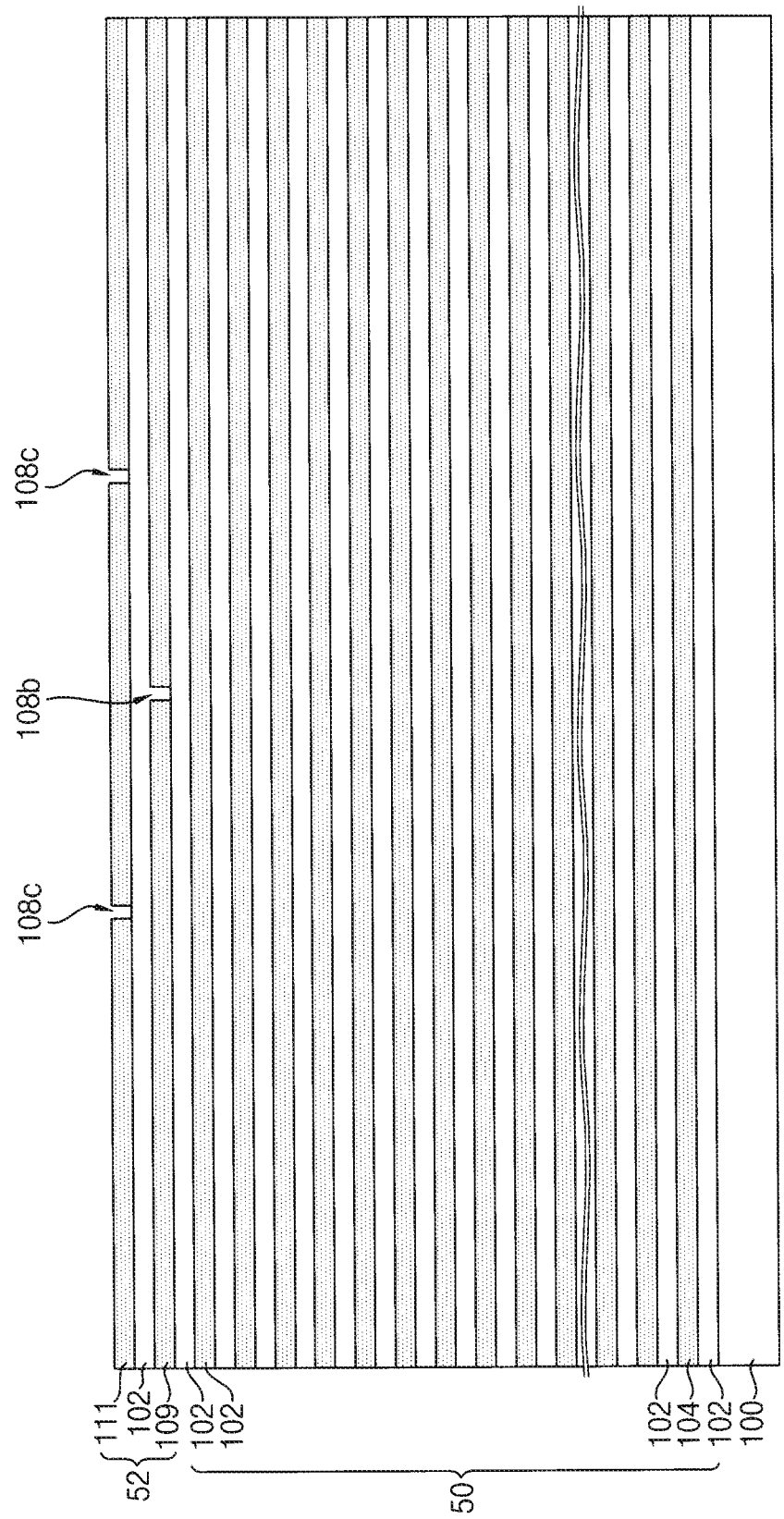
Figure 28:
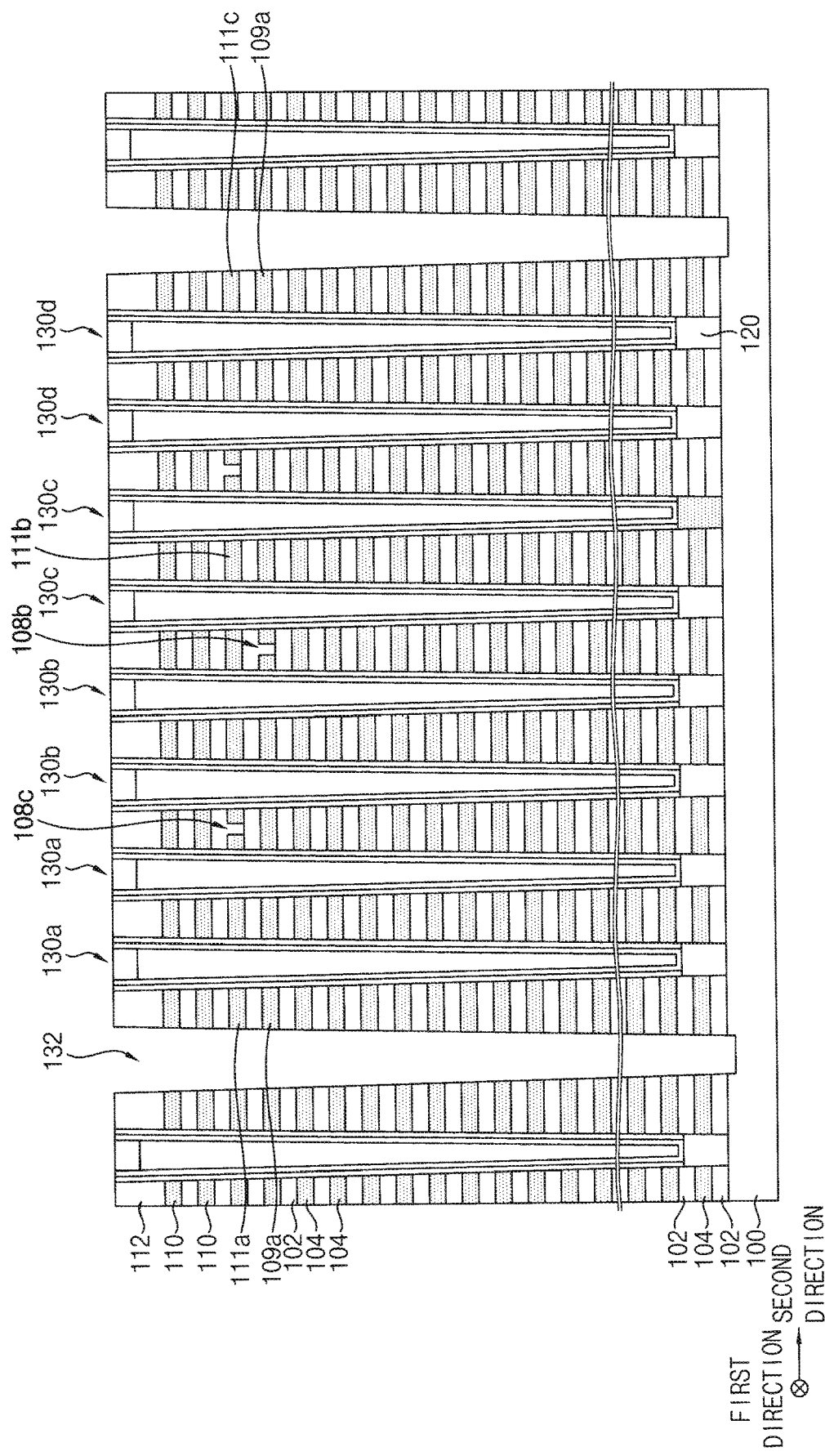

FIGS. 27 and 28 are cross-sectional views illustrating stages of a method of manufacturing a vertical semiconductor device in accordance with some example embodiments.

Referring to FIG. 27, insulation layers 102 and first sacrificial layers may be alternatelyand repeatedly formed on a substrate 100. Thus, a first mold structure 50 may be formed on the substrate 100. A second mold structure 52 including a preliminary second sacrificial pattern 109 and 111 and the insulation layer 102 may be formed on the first mold structure 50a the second mold structure 52. As shown in FIG. 27, the preliminary second sacrificial pattern 109, 111 may be replaced with a gate pattern of string selection transistors through a subsequent process. Thus, a lower second sacrificial pattern 109 may include a first lower trench 108b, and an upper second sacrificial pattern 109 may include a first upper trench 108c.

Referring to FIG. 28, the insulation layers 102 and fourth sacrificial layers 110 may be alternately stacked on the second mold structure 52. One of the insulation layer 102 may fill the first upper trench 108c. An upper insulation layer 112 may be formed on an uppermost fourth sacrificial layer 110.

The channel structure 130a, 130b, 130c and 130d may be formed through the upper insulation layer 112, the insulation layers 102, the fourth sacrificial layers 110, the preliminary second sacrificial patterns 109 and 111 and the first sacrificial layers 104.

Thereafter, the upper insulation layer 112, the insulation layer 102, the fourth sacrificial layer 110, the preliminary second sacrificial patterns 109 and 111, and the first sacrificial layers 104 may be etched, e.g. anisotropically etched, to form a second trench exposing an upper surface of the substrate 100. Thus, the preliminary second sacrificial patterns 109 and 111 may be transformed lower second sacrificial pattern patterns 109a and 109b and the upper second sacrificial pattern patterns 111a, 111b, and 111c.

The above processes may be similar to those illustrated with reference to FIGS. 11 to 15, and descriptions of similar features may be omitted for brevity.

Subsequently, processes similar to those illustrated with reference to FIGS. 16 to 17 may be performed.

Thereafter, some of string selection transistors SST1, SST2, SST3, SST4 may be programmed. Therefore, the vertical semiconductor device illustrated with reference to FIGS. 25 and 26 may be manufactured.

Figure 29:
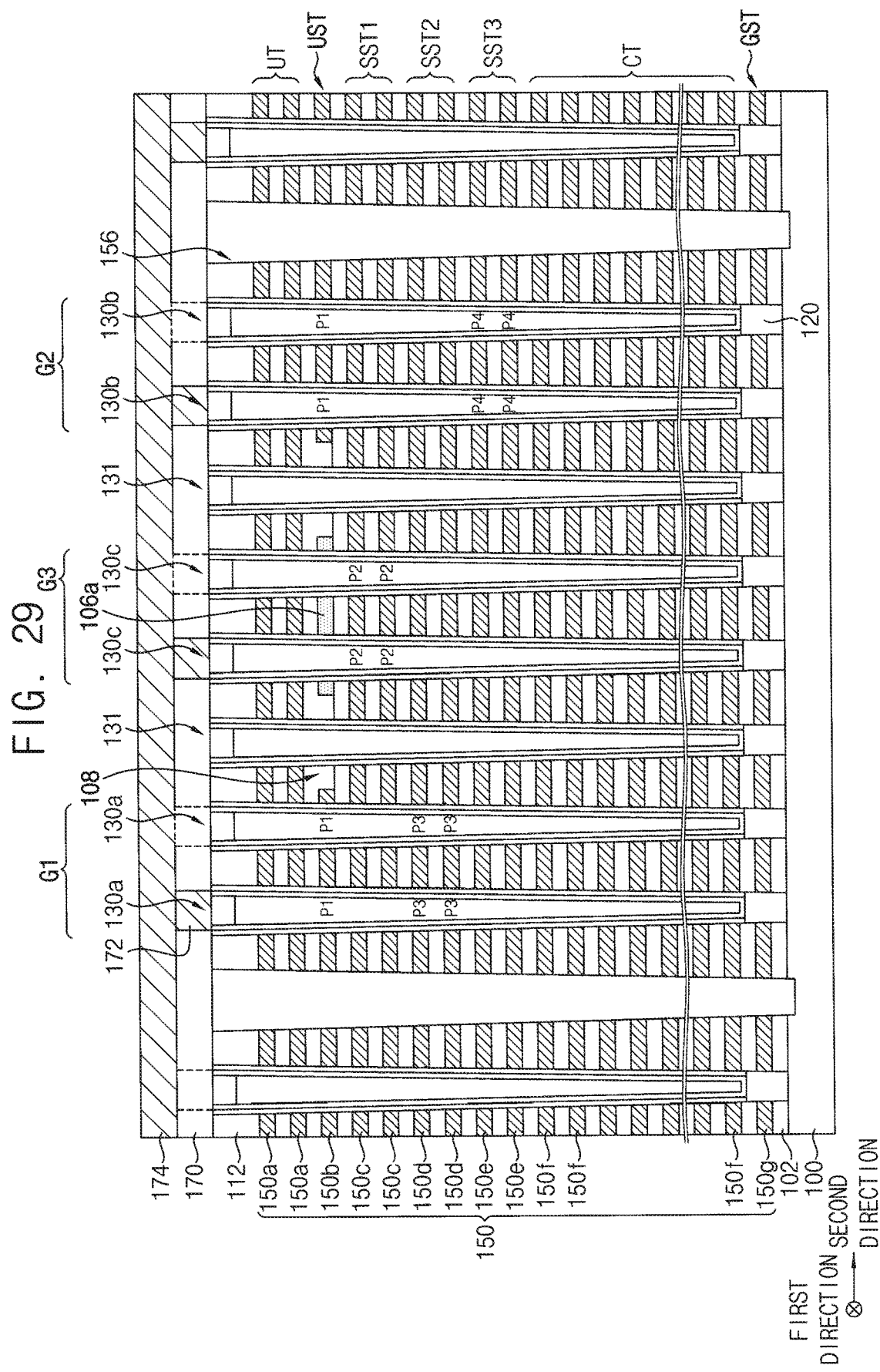

FIG. 29 is a cross-sectional view illustrating a vertical semiconductor device according to example embodiments.

The vertical semiconductor device may be the same as that illustrated with reference to FIG. 1, except for the inclusion of a dummy channel structure 131.

Referring to FIG. 29, the vertical semiconductor device may include the stacked structure 156 on the substrate 100 and the channel structures 130a, 130b and 130c passing through the stacked structure 156.

Further, a dummy channel structure 131 may be formed between the intermediate sacrificial pattern 106a and the gate pattern 105b. That is, the dummy channel structure 131 may pass through the insulation layer 102 filling a portion between the intermediate sacrificial pattern 106a and the gate pattern 105b.

As the dummy channel structure 131 is formed, a width of the first trench 108 between the intermediate sacrificial pattern 106a and the gate pattern 105b may increase. For example, the width of the first trench 108 may be greater than a width of the dummy channel structure 131.

The dummy channel structure 131 may have a stacked structure and a shape substantially the same as a stacked structure and a shape of the channel structures 130a, 130b, and 130c. However, the dummy channel structure 131 may not be electrically connected to upper wirings, e.g., a bit line contact and a bit line. The dummy channel structure 131 may be floating electrically.

Some of the string selection transistors SST1, SST2, SST3 and the upper selection transistor UST may be programmed. The programmed state and programming method of the upper selection transistor UST and the string selection transistors SST1, SST2, SST3 may be substantially the same as those illustrated with reference to FIG. 1.

Figure 30:
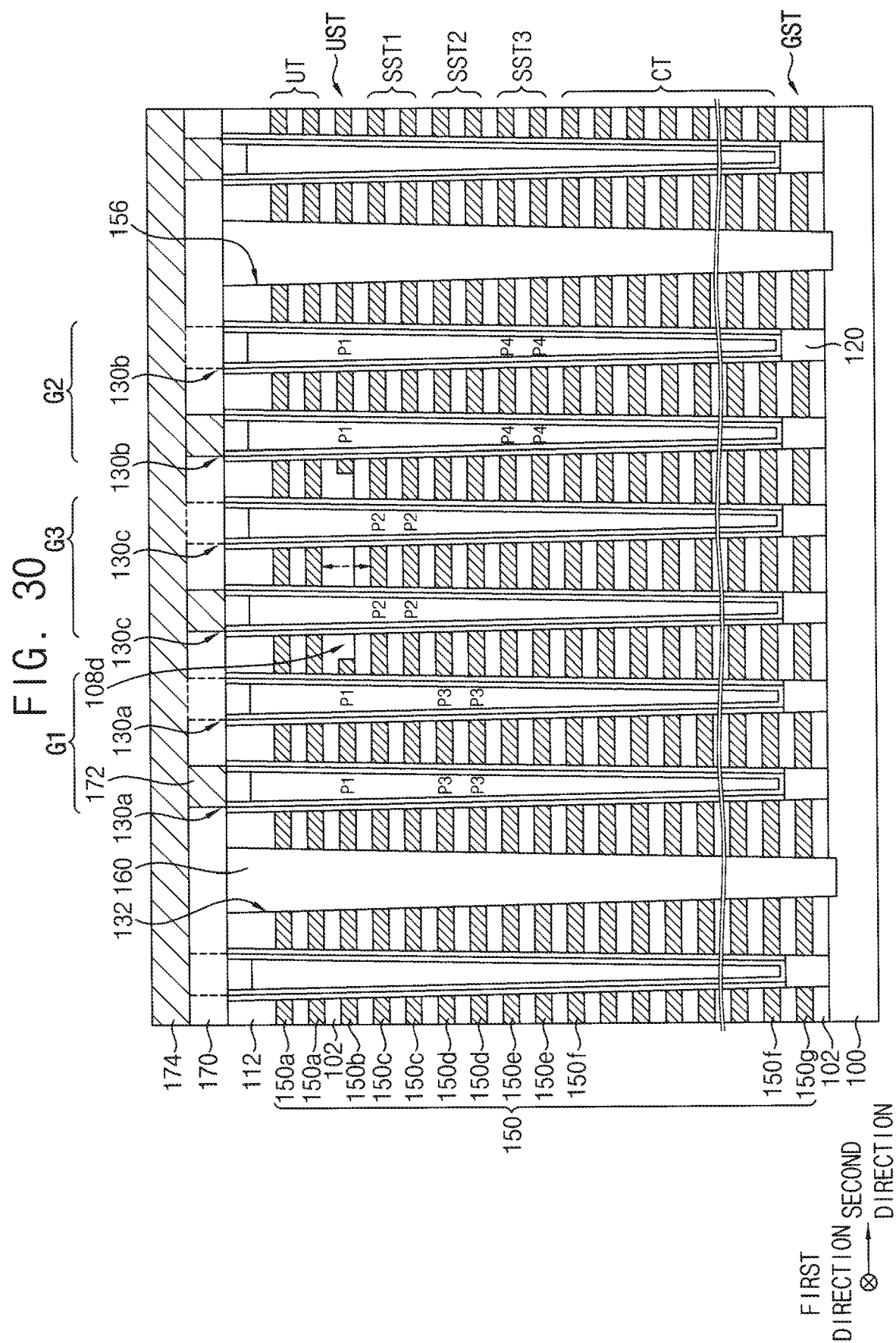

FIG. 30 is a cross-sectional view illustrating a vertical semiconductor device in accordance with some example embodiments.

The vertical semiconductor device may be the same as that illustrated with reference to FIG. 1, except for no intermediate sacrificial pattern 106a.

Referring to FIG. 30, the vertical semiconductor device may include the stacked structure 156 on a substrate 100 and the channel structures 130a, 130b, and 130c passing through the stacked structure 156.

In some example embodiments, an intermediate sacrifice pattern may not be formed between the upper selection transistors UST. A width of the first trench 108d between gate patterns 150b of the upper selection transistors UST may increase, and one of the insulation layers 102 may be formed to fill the first trench 108d. The insulation layers 102 between the gate patterns 150b of the upper selection transistors UST may be merged to one insulation layer. Thus, the insulation layer 102 between the gate patterns 150b of the upper selection transistors UST may have a vertical height higher than a vertical height of one of other insulation layers.

For example, the width of the first trench 108d may be increased such that two channel structures 130c may be disposed in the second direction within the first trench 108d. The channel structure 130c may pass through the insulation layer 102 between the gate patterns 150b of the upper selection transistor UST.

Some of the string selection transistors and the upper selection transistors may be programmed. A programmed state and programming method of the upper selection transistor and the string selection transistor may be the same as those illustrated with reference to FIG. 1.

FIG. 31 is a cross-sectional view illustrating a method of manufacturing a vertical semiconductor device in accordance with some example embodiments.

The method of manufacturing the vertical type semiconductor device may be substantially the same as that illustrated with reference to FIGS. 8 to 18, except for the sacrificial pattern 109.

Referring to FIG. 31, the insulation layers 102 and the first sacrificial layers may be alternately and repeatedly formed on the substrate 100. Thus, the first mold structure 50 may be formed on the substrate 100. The second mold structure including the second sacrificial pattern 109 and the insulation layer 102 may be formed on the first mold structure 50. As shown in FIG. 31, the second sacrificial pattern 109 may be replaced with a gate pattern of upper selection transistors through a subsequent process.

A first trench 108d may be formed between the second sacrificial patterns 109. At least two channel structures may be disposed in the second direction within the first trench 108d.

Thereafter, the insulation layer 102 and the fourth sacrificial layer 110 may be alternately stacked on the second mold structures. One of the insulation layers 102 may fill the first trenches 108d. The upper insulation layer 112 may be formed on an uppermost fourth sacrificial layer 110.

Subsequently, processes the same as those illustrated with reference to FIGS. 12 to 19 may be performed to form the vertical semiconductor device shown in FIG. 30.

The upper selection transistors and some of the string selection transistors may be programmed. The programmed state and programming method of the upper selection transistor and the cell selection transistor may be substantially the same as those illustrated with reference to FIG. 1.

The foregoing is illustrative of example embodiments and is not to be construed as limiting thereof. Although a few example embodiments have been described, those of ordinary skill in the art will readily appreciate that many modifications are possible in the example embodiments without materially departing from the novel teachings and advantages of the present inventive concept. Accordingly, all such modifications are intended to be included within the scope of the example embodiments as defined in the claims. In the claims, any clause interpreted under 35 U.S.C. § 112(f) is intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical semiconductor device, comprising:
a substrate including an upper surface;
a stacked structure including insulation layers and gate patterns, the insulation layers alternately and repeatedly stacked with the gate patterns on the substrate, the stacked structure extending in a first direction parallel to the upper surface of the substrate, the gate patterns including a first gate patterns, and the stacked structure including a sacrificial pattern at a same level as the first gate pattern; and
a plurality of channel structures passing through the stacked structure, each of the channel structures extending to the upper surface of the substrate, and each of the channel structures including a charge storage structure and a channel,
wherein, in the stacked structure, at least one of the channel structures passes through the sacrificial pattern to the upper surface of the substrate and extends to the upper surface of the substrate; and
the stacked structure includes the gate patterns of a plurality of string selection transistors, and the sacrificial pattern is between gate patterns of at least two of the string selection transistors in a lateral direction.

2. The vertical semiconductor device of claim 1, wherein the at least one of the channel structures passes through the first gate pattern adjacent to both sides of the sacrificial pattern.

3. The vertical semiconductor device of claim 1, wherein each of the gate patterns corresponds to a gate of a transistor selected from the group including a ground selection transistor, cell transistors, and the string selection transistors, and the sacrificial pattern is above the gate patterns of the cell transistors.

4. The vertical semiconductor device of claim 1, wherein a trench is between the sacrificial pattern and the first gate pattern, and the sacrificial pattern is spaced apart from the first gate pattern.

5. The vertical semiconductor device of claim 4, wherein the trench extends in the first direction in a straight line or in a zig-zag.

6. The vertical semiconductor device of claim 1, wherein the sacrificial pattern includes an insulation material different from insulation materials in the insulation layers.

7. The vertical semiconductor device of claim 6, wherein the sacrificial pattern includes silicon nitride, and
the insulation layer includes silicon oxide.

8. The vertical semiconductor device of claim 1, wherein gate patterns adjacent both sides of the sacrificial pattern are configured to be programmed to have positive threshold voltages.

9. The vertical semiconductor device of claim 1, wherein ones of a plurality of gate patterns under the sacrificial pattern are configured to be programmed to have positive threshold voltages.

10. The vertical semiconductor device of claim 1, wherein gate patterns adjacent to sides of the sacrificial pattern and under the sacrificial pattern correspond to gates of the string selection transistors.

11. The vertical semiconductor device of claim 1, wherein the gate patterns adjacent to both sides of the sacrificial pattern correspond to gates of upper selection transistors, and the gate patterns under the sacrificial pattern correspond to gates of the string selection transistors.

12. A vertical semiconductor device, comprising:
a substrate including an upper surface;
a stacked structure including insulation layers and gate patterns on the substrate, the insulation layers alternately and repeatedly stacked with the gate patterns, the stacked structure extending in a first direction, the first direction parallel to the upper surface of the substrate, the gate patterns including first gate patterns, and the first gate patterns are spaced apart from each other at the same level in a second direction, the second direction parallel to the upper surface of the substrate and perpendicular to the first direction;
first channel structures and second channel structures, the first channel structures and the second channel structures passing through the stacked structure, each of the first channel structures and second channel structures extending to the upper surface of the substrate, and each of the first and second channel structures including a charge storage structure and a channel; and
a sacrificial pattern at a same level as one of the first gate patterns,
wherein each of the first channel structures passes through the first gate patterns, and each of the second channel structures passes through a portion between the first gate patterns, and
wherein the stacked structure includes the gate patterns of a plurality of string selection transistors, and the sacrificial pattern is between gate patterns of at least two of the string selection transistors in a lateral direction.

13. The vertical semiconductor device of claim 12,
wherein the sacrificial pattern including an insulation material different from a material of the insulation layers.

14. The vertical semiconductor device of claim 13, wherein a trench is between the sacrificial pattern and the first gate patterns, and
the trench extends in the first direction to have a straight line or a zig-zag.

15. The vertical semiconductor device of claim 12, further comprising:
a second insulation layer between the first gate patterns.

16. The vertical semiconductor device of claim 12, wherein each of the gate patterns corresponds to a gate of a transistor selected from the group including a ground selection transistor, cell transistors, and the string selection transistors, and the first gate patterns are above the gate patterns corresponding to the cell transistors.

17. The vertical semiconductor device of claim 16, wherein at least one of the first gate patterns is configured to be programmed to have a positive threshold voltages.

18. A vertical semiconductor device, comprising:
a substrate having an upper surface;
a stacked structure including insulation layers and gate patterns on the substrate, the insulation layers alternately and repeatedly stacked with the gate patterns, the stacked structure extending in a first direction parallel to the upper surface of the substrate, the gate patterns including at least one first gate patterns, the stacked structure including a sacrificial pattern at a same level as one of the first gate pattern; and
first channel structures and second channel structures, the first channel structures and the second channel structures passing through the stacked structure, each of the first channel structures and second channel structures extending to the upper surface of the substrate, and each of the first and second channel structures including a charge storage structure and a channel, wherein a plurality of first channel structures and second channel structures are arranged in a second direction, the second direction parallel to the upper surface of the substrate and perpendicular to the first direction in the stacked structure, each of the first channel structures passes through the first gate patterns, each of the second channel structures passes through the sacrificial pattern, and the stacked structure includes the gate patterns of a plurality string selection transistors, and the sacrificial pattern is between gate patterns of at least two the string selection transistors in a lateral direction.

19. The vertical semiconductor device of claim 18, wherein a plurality of the gate patterns under the sacrificial pattern correspond to gates of the string selection transistors.

20. The vertical semiconductor device of claim 19, wherein at least one of the gate patterns of the string selection transistors is configured to be programmed to have a positive threshold voltage.

* * * * *